(12) United States Patent
Matsui et al.

(10) Patent No.: US 12,185,518 B2
(45) Date of Patent: Dec. 31, 2024

(54) LAMINATED SHEET

(71) Applicant: Toray Industries, Inc., Tokyo (JP)

(72) Inventors: Hisato Matsui, Otsu (JP); Hideaki Toyama, Otsu (JP); Wataru Gouda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 468 days.

(21) Appl. No.: 17/777,171

(22) PCT Filed: Nov. 11, 2020

(86) PCT No.: PCT/JP2020/042010
§ 371 (c)(1),
(2) Date: May 16, 2022

(87) PCT Pub. No.: WO2021/100566
PCT Pub. Date: May 27, 2021

(65) Prior Publication Data
US 2022/0408618 A1    Dec. 22, 2022

(30) Foreign Application Priority Data
Nov. 18, 2019 (JP) .................................. 2019-207630

(51) Int. Cl.
*H05K 9/00* (2006.01)
*B32B 7/025* (2019.01)
(Continued)

(52) U.S. Cl.
CPC ........... *H05K 9/0088* (2013.01); *B32B 7/025* (2019.01); *B32B 7/12* (2013.01); *B32B 25/042* (2013.01);
(Continued)

(58) Field of Classification Search
CPC .... H05K 9/0088; H05K 9/0083; B32B 7/025; B32B 25/042; B32B 25/16; B32B 27/08;
(Continued)

(56) References Cited

U.S. PATENT DOCUMENTS 4,738,882 A * 4/1988 Rayford .................. B32B 15/09
428/218
6,316,110 B1 * 11/2001 Anzaki ..................... H01J 11/10
359/359

(Continued)

FOREIGN PATENT DOCUMENTS

| JP | 6281450 A | 4/1987 |
| JP | 2003158395 A | 5/2003 |

(Continued)

OTHER PUBLICATIONS

International Search Report and Written Opinion for International Application No. PCT/JP2020/042010, dated Dec. 28, 2020, 6 pages.

*Primary Examiner* — Jason L McCormack
(74) *Attorney, Agent, or Firm* — BUCHANAN INGERSOLL & ROONEY PC

(57) ABSTRACT

The present invention aims to provide a multi-layer sheet with excellent electromagnetic wave shielding properties. The multi-layer sheet includes an alternating multilayer unit with five or more A layer and B layer alternately laminated, in which the electromagnetic return loss at the peak top in the peak of return loss spectrum with the highest return loss at the peak top is 5 dB or more in a chart of the return loss in the multi-layer sheet.

17 Claims, 2 Drawing Sheets

(51) Int. Cl.
*B32B 7/12* (2006.01)
*B32B 25/04* (2006.01)
*B32B 25/16* (2006.01)
*B32B 27/08* (2006.01)
*B32B 27/20* (2006.01)
*B32B 27/32* (2006.01)
*B32B 27/36* (2006.01)

(52) U.S. Cl.
CPC ............. *B32B 25/16* (2013.01); *B32B 27/08* (2013.01); *B32B 27/20* (2013.01); *B32B 27/32* (2013.01); *B32B 27/36* (2013.01); *B32B 2250/42* (2013.01); *B32B 2264/108* (2013.01); *B32B 2307/202* (2013.01); *B32B 2307/212* (2013.01); *B32B 2307/732* (2013.01); *H05K 9/0083* (2013.01)

(58) Field of Classification Search
CPC ......... B32B 27/20; B32B 27/32; B32B 27/36; B32B 2250/42; B32B 2250/05; B32B 2264/108; B21B 2307/202; B21B 2307/212; B21B 2307/732; B21B 2307/204
USPC ....................................................... 250/515.5
See application file for complete search history.

(56) References Cited

U.S. PATENT DOCUMENTS

| | | | |
|---|---|---|---|
| 2009/0072186 A1* | 3/2009 | Hsu ................... | H05K 9/0083 |
| | | | 252/62.55 |
| 2009/0109537 A1* | 4/2009 | Bright ................. | G02B 5/287 |
| | | | 359/588 |
| 2015/0337105 A1* | 11/2015 | Takahashi ........... | B32B 27/08 |
| | | | 428/688 |
| 2017/0373386 A1* | 12/2017 | Larson ................ | H01Q 19/18 |
| 2020/0035925 A1 | 1/2020 | Isogai et al. | |

FOREIGN PATENT DOCUMENTS

| | | |
|---|---|---|
| JP | 2011502285 A | 1/2011 |
| JP | 2012099665 A | 5/2012 |
| JP | 2017118073 A | 6/2017 |
| JP | 2019057730 A | 4/2019 |
| JP | 2019102665 A | 6/2019 |
| WO | 2014087883 A1 | 6/2014 |
| WO | 2018180146 A1 | 10/2018 |

* cited by examiner

LAMINATED SHEET

CROSS REFERENCE TO RELATED APPLICATIONS

This is the U.S. National Phase application of PCT/JP2020/042010, filed Nov. 11, 2020 which claims priority to Japanese Patent Application No. 2019-207630, filed Nov. 18, 2019, the disclosures of each of these applications being incorporated herein by reference in their entireties for all purposes.

FIELD OF THE INVENTION

The present invention relates to multi-layer sheets having excellent electromagnetic wave shielding properties.

BACKGROUND OF THE INVENTION

Communication technology has advanced to use very high frequency in the bandwidth of several hundreds of MHz to several GHz mainly in cellular phones, wireless communications, and the like; super high frequency in the bandwidth of several GHz to several tens of GHz mainly in mobile communications such as 4G and 5G, wireless LAN (Wi-fi) communications, and the like; and extremely high frequency in the bandwidth of several tens of GHz to several hundreds of GHz mainly in automotive collision avoidance radars and the like. This means that electromagnetic waves in a variety of frequency bands are flying through the atmosphere. The frequency band of an electromagnetic wave is appropriately selected to be compatible with the information capacity, transmission distance, and applications. However, there are concerns about device malfunctions, communication problems, and information leakages due to the use of electromagnetic waves in the close frequency bands in various devices and applications. Furthermore, the effects on the human body, which is sensitive to electromagnetic waves, have been pointed out. To cope with such concerns and points, electromagnetic wave shielding materials for providing shielding against electromagnetic waves have been increasingly required. In particular, development of communication technology using electromagnetic waves in the GHz frequency band to achieve high-speed and large-capacity communications has accelerated in recent years. Thus, electromagnetic wave shielding materials that enable shielding against electromagnetic waves in the frequency band are required.

Electromagnetic waves transmit through a space as waves comprising two components, electric field and magnetic field. Electromagnetic wave shielding materials that block electromagnetic waves refer to materials that reflect electromagnetic waves at the surface and inside of the materials, or absorb electromagnetic waves inside of the materials, resulting in loss or attenuation of the energy of the electromagnetic waves. This effect can be improved by combining reflection and absorption. For example, the effect of the electromagnetic wave reflecting method by reflection on the surface of a material can be improved by making the electrical resistance values (impedance calculated based on the relative dielectric constant) of the air interface and the electromagnetic wave shielding material interface different. In general, a material with a very low resistance value, such as material (copper), can be applied and deposited on the surface of a substrate to obtain electromagnetic wave shielding properties over a broad frequency band (Patent Literature 1). On the other hand, the electromagnetic wave absorption technology by absorption inside a material is one in which electrically conducting additives and/or magnetic additives are contained inside a material, and electromagnetic waves that enter the material are converted into induced current, resulting in loss of the energy of the electromagnetic waves. The absorption performance is achieved by containing carbon materials or metallic materials such as ferrites in dielectric polymers such as rubbers (Patent Literature 2 to 4). Lamination of layers with different impedances results in interference and cancellation between electromagnetic waves that have been reflected on the front and back sides of the electromagnetic wave shielding material, and cause loss (Patent Literature 5).

In particular, the electromagnetic wave shielding properties obtained by absorption vary depending on the factors such as the combination of the substrate exhibiting dielectricity (insulating properties) and the electrically conducting additives contained inside, the thickness of the substrate, and the formulation of the electrically conducting additives (types, combination, and amounts of the materials). The state of alignment of electrically conducting additives within the substrate is also an important factor. There is also a finding called the Maxwell-Wagner effect, in which electrically conducting additives are arranged in a certain direction and stacked side by side to improve the conductivity, thereby increasing the overall effectiveness of the shielding material (Non-patent Literature 1).

Patent Literature

Patent Literature 1: JP 2011-502285 A
Patent Literature 2: JP 2003-158395 A
Patent Literature 3: JP 2017-118073 A
Patent Literature 4: JP 2019-057730 A
Patent Literature 5: JP 2019-102665 A Non-Patent Literature Non-Patent Literature 1: Z. M. Dang, Prog. Matter. Sci., 2012, 57, 660-723

SUMMARY OF THE INVENTION

Electromagnetic wave shielding materials using electro-conductive reflection technologies as described in Patent Literature 1, in which metal sputtering, vacuum deposition, or a technology of coating the outermost layer with a paste material containing an electrically conducting additive and/or magnetic additive is used, may cause problems in view of short circuit in electronic equipment and communication equipment due to peeling, and durability. On the other hand, with respect to electromagnetic wave shielding materials taking advantage of magnetic absorption or dielectric absorption as described in Patent Literature 2 to 5, existing technologies in which a substrate contains an electrically conducting additive have required thickening the substrate, or increasing the amount of the electrically conducting additive in order to increase the absolute value of the electromagnetic return loss (increase the electromagnetic wave shielding properties). That is, when materials to be used are determined, the electromagnetic wave shielding properties will be determined in proportion to the product of the amount of the electrically conducting additive contained per unit volume of the substrate and the thickness of the substrate (such a relationship is referred to as "volume law"). However, when the thickness of the substrate is large, the electromagnetic wave shielding material become firmer, and thus it is difficult to use it in applications that require moldability, e.g., winding around cables and combination of shielding materials along housings having complex irregular shapes.

On the other hand, considering the moldability and production efficiency of shielding materials, continuous sheeting by melt extrusion using thermoplastic resins is preferred as compared to pressed products using thermoplastic resins. In formation of a sheet containing a high concentration of an electrically conducting additive, the thickening effect (thixotropic behavior) of the resin composition during extrusion is enhanced, which causes uneven discharge during extrusion molding into a sheet shape, making it difficult to form sheets with uniform thickness and making sheets weaker and prone to cracking.

To solve the above problems, the present invention has the following constitution.

A multi-layer sheet comprising an alternating multilayer unit including a total of five or more alternately laminated layers of two conductively different layers, wherein for convenience the less conductive layer is called A layer and the more conductive layer is called B layer; wherein, when the frequency-return loss curve for the multi-layer sheet is determined by plotting the loss on the vertical axis and the frequency on the horizontal axis, the return loss at the peak top in the peak of return loss spectrum with the highest return loss at the peak top is 5 dB or more.

The multi-layer sheet of the present invention shows high electromagnetic wave shielding properties. Thus, the multi-layer sheet of the present invention can be suitably used as an electromagnetic wave shielding material. In a more preferred embodiment, a lamination structure with a layer with higher conductivity and a layer with lower conductivity alternately laminated enables having sharp and high electromagnetic wave shielding properties against a specific frequency band. Furthermore, even if the amounts of electrically conducting additives are small, and the film is thin, the multi-layer sheet of the present invention can obtain comparable levels of electromagnetic wave shielding properties as compared with conventional technologies. Thus, mold-following properties for applied products and improvement of stable production of the sheet are expected.

DETAILED DESCRIPTION OF EMBODIMENTS OF THE INVENTION

Figure 1:
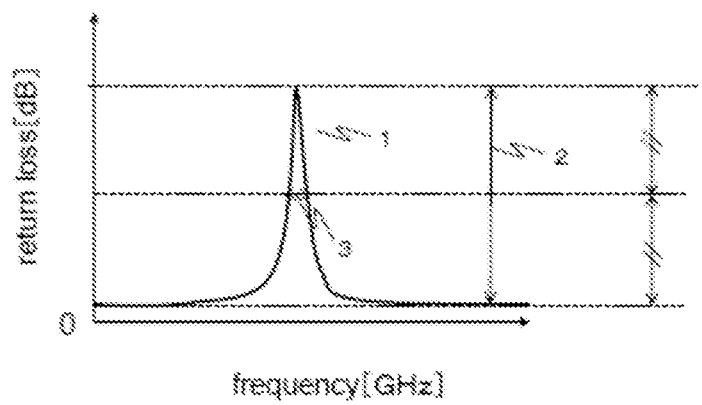
FIG. 1 is a schematic view depicting the half bandwidth of the peak of return loss spectrum with the highest return loss at the peak top, and the return loss at the peak top in the frequency-return loss curve of a multi-layer sheet in one embodiment of the present invention.

The multi-layer sheet of the present invention will be described in detail below.

The multi-layer sheet according to embodiments of the present invention is required to be a multi-layer sheet comprising an alternating multilayer unit with a total of five or more conductively different A layer and B layer that are alternately laminated, wherein, when the frequency-return loss curve for the multi-layer sheet is determined by plotting the return loss on the vertical axis and the frequency on the horizontal axis, the return loss at the peak top in the peak of return loss spectrum with the highest return loss at the peak top (return loss RL) is 5 dB or more. The frequency-return loss curve is determined by the measurement method described later.

The multi-layer sheet according to embodiments of the present invention comprises different layers, A layer and B layer, with different conductivities. The materials constituting the A layer and B layer include, but not limited to, transparent/opaque materials, flexible/rigid materials, flat/non-flat materials, and organic (polymer)/inorganic (metal) materials, and preferably are substrates comprising flexible organic polymer materials in view of processability. Especially, thermoplastic resins are desirably contained as main components. As used herein, the term "contained as a main component" refers to the layer that comprises a single thermoplastic resin, or is in a state where a thermoplastic resin is used as a matrix resin and other materials such as electrically conducting additives and magnetic additives are dispersed in the resin.

The multi-layer sheet of the present invention may also use, for example, hard coating using a thermosetting resin or a photosetting resin.

The A layer and B layer in the multi-layer sheet according to embodiments of the present invention are required to be layers with different conductivities. Conveniently, and in consideration of preferred embodiments of the multi-layer sheet as described later, the layer with lower conductivity is referred to as A layer, while the layer with higher conductivity is referred to as B layer. The A layer and B layer with different conductivities means that they have different surface resistance values, which is an index of the conductivity/insulating properties in the layer direction (sheet plane direction). Specifically, the A layer and B layer with different conductivities means that, when the higher surface resistance value of those of the A layer and B layer is $\alpha$ [$\Omega/\square$], and the lower surface resistance value is $\beta$ [$\Omega/\square$], then $\alpha/\beta$ of 1.1 or more. $\alpha/\beta$ is preferably $10^2$ or more, more preferably $10^5$ or more, and still more preferably $10^9$ or more. Good electromagnetic wave shielding properties are express when the surface resistance value, an index of the conductivity/insulating properties, is less than $1.0 \times 10^5 [\Omega/\square]$, and thus it is more preferable that the A layer has a surface resistance value of $1.0 \times 10^5 [\Omega/\square]$ or more, while the B layer has a surface resistance value of less than $1.0 \times 10^5 [\Omega/\square]$, with the surface resistance values showing the ratio as described above. The method of allowing the A layer and B layer to have different conductivities is not particularly limited. Simple material designs for allowing the A layer and B layer to have different conductivities include forming the A layer and B layer using compositions that contain electrically conducting additives in their matrices, and the conductivities may be different by using materials with different relative dielectric constants as the materials of the matrices, or the conductivities may be different by allowing different types and/or amounts of electrically conducting additives to be contained. As described in detail later, it is important to control the relative dielectric constant values into specific value ranges in order to achieve high electromagnetic return loss in a specific frequency band. In order to adjust the frequency of the peak of return loss spectrum into a desired frequency band while maintaining the electromagnetic return loss, it is preferable that the conductivities of the A layer and B layer can be finely adjusted. In the most preferred embodiment, electrically conducting additives and/or magnetic additives are contained in the A layer and/or B layer to make the relative dielectric constants of the A layer and B layer different. As used herein, the term "relative dielectric constant" refers to a dimensionless quantity that expresses the magnitude of the dielectric constant based on the dielectric constant in vacuum (electric constant). Hereinafter, relative dielectric constant is referred to as simply "dielectric constant".

The surface resistance value means the resistance of a sample determined at the surface of the sample. The surface resistance value can be determined by separating the interface where the A layer and B layer are laminated and exposing the interface, but can be easily and reproducibly determined by slicing the layers to expose the surface of the sample and measuring it.

In order for the multi-layer sheet according to embodiments of the present invention to exhibit a high loss value in the peak of return loss spectrum with the highest return loss at the peak top, it is important that one of the A layer and B layer comprising the alternating multilayer unit be designed to exhibit higher dielectric constant. Usually, the higher dielectric constant is often achieved with conventional technologies of monolayer sheet by containing high concentrations of electrically conducting additives and/or magnetic additives to be contained in the resin to increase the dielectric constant, or thickening the sheet thickness. However, the multi-layer sheet of the present invention can obtain an effect of improving the dielectric constant beyond the volume law as compared with a monolayer sheet containing the same weights and concentrations of electrically conducting additives and/or magnetic additives, by allowing one layer to have higher dielectric constant and the other layer to have lower dielectric constant to provide dielectric constant difference, which lead to effects of dielectric polarization that occurs in the layer interface between the layer with higher dielectric constant and the layer with lower dielectric constant (occurrence of dipolar moment). To make a dielectric polarization that contributes to the improvement of the dielectric constant occur strongly, how to increase the difference in the dielectric constants of the alternately provided A layer and B layer is an important designing point. Means for allowing the dielectric constants to differ greatly include the types of the resins used in the A layer and B layer, and difference in the amounts of the electrically conducting additives and/or magnetic additives contained in the A layer and/or B layer, as described above. In a preferred embodiment, only one of A layer and B layer contains an electrically conducting additive, while the other layer is composed of a single resin containing no electrically conducting additive. In a more preferred embodiment, the layer containing no electrically conducting additive comprises a resin with lower dielectric constant, while the layer containing an electrically conducting additive comprises a resin exhibiting higher dielectric constant, with the electrically conducting additive contained in high concentration. As described later, increasing the number of the layers preferably results in increase in the number of the interfaces where dielectric polarization occurs, and decreasing the thicknesses of the layers preferably results in increase in the number of the interfaces per unit thickness. Thus, the number of the interfaces between A layer and B layer per unit thickness of the alternating multilayer unit is preferably 2 interfaces/100 µm or more, more preferably 5 interfaces/100 µm or more, and still more preferably 10 interfaces/100 µm or more. There is no particular upper limit as long as the multi-layer group can be manufactured stably, but the number of the interfaces is usually 150 interfaces/100 µm or less from the viewpoint of the productivity. In addition, the ratio of the surface resistance value of the A layer to the B layer (A layer/B layer) is preferably $1 \times 10^{10}$ or more, and more preferably $1 \times 10^{12}$.

Preferred flexible organic polymer materials that can be preferably used in the present invention are thermoplastic resins especially from the viewpoint of good sheet processability and film formation properties. Examples of the thermoplastic resins that can be used include polyolefin resins, as represented by polyethylene, polypropylene, poly(1-butene), poly(4-methylpentene), polyisobutylene, polyisoprene, polybutadiene, polyvinylcyclohexane, polystyrene, poly(α-methylstyrene), poly(p-methylstyrene), polynorbornene, and polycyclopentene; polyamide resins, as represented by Nylon 6, Nylon 11, Nylon 12, and Nylon 66; vinyl monomer-containing copolymer resins, as represented by ethylene/propylene copolymers, ethylene/vinylcyclohexane copolymers, ethylene/vinylcyclohexene copolymers, ethylene/alkylacrylate copolymers, ethylene/acrylmethacrylate copolymers, ethylene/norbornene copolymers, ethylene/vinyl acetate copolymers, propylene/butadiene copolymers, isobutylene/isoprene copolymers, and vinyl chloride/vinyl acetate copolymers; acrylic resins, as represented by polyacrylate, polymethacrylate, polymethyl methacrylate, polyacrylamide, and polyacrylonitrile; polyester resins, as represented by polyethylene terephthalate, polypropylene terephthalate, polybutyrene terephthalate, and polyethylene-2,6-naphthalate; polyether resins, as represented by polyethylene oxide, polypropylene oxide, and polyacrylene glycol; cellulose ester resins, as represented by diacetyl cellulose, triacetyl cellulose, propionyl cellulose, butyryl cellulose, cellulose acetate propionate, and nitrocellulose; and biodegradable polymers, as represented by polylactic acid and polybutyl succinate; as well as polyvinyl chloride, polyvinylidene chloride, polyvinyl alcohol, polyvinyl butyral, polyacetal, polyglycolic acid, polycarbonate, polyketone, polyethersulfone, polyether ether ketone, modified polyphenyleneether, polyphenylene sulfide, polyetherimide, polyimide, polysiloxane, polytetrafluoroethylene resins, polytrifluoroethylene resins, polychlorotrifluoroethylene resins, tetrafluoroethylene-hexafluoropropylene copolymers, and polyvinylidene fluoride. These thermoplastic resins may be used alone or as polymer blends or polymer alloys of two or more of them. Blends or alloys can be used to obtain heat resistance, viscosity characteristics, adhesion at the interlayer interface, and the like that cannot be obtained by using one thermoplastic resin.

As described above, the multi-layer sheet according to embodiments of the present invention is a multi-layer sheet comprising an alternating multilayer unit with conductively different layers alternately laminated, which exhibits dielectric polarization in the interface between the conductively different A layer and B layer, and can provide an effect of further improving the electromagnetic wave shielding properties. Thus, the dielectric constant of the thermoplastic resin constituting each layer is an important factor. Therefore, the resin constituting the A layer and the resin constituting the B layer preferably have different dielectric constants. Specifically, a resin exhibiting a dielectric constant of 3.0 or less is preferably selected as the resin with lower dielectric constant, and is preferably selected from thermoplastic resins such as polyolefin resins (dielectric constant: 2.0 to 2.3), polyester resins (dielectric constant: 2.8 to 3.0), polycarbonates (dielectric constant: 2.9 to 3.0), and polystyrenes (dielectric constant: 2.4 to 2.6) taking into account versatility, processability, lamination, and other properties. More preferably, such a resin is used especially in a layer not containing any electrically conducting additive.

On the other hand, the thermoplastic resin that can be preferably used in the layer containing an electrically conducting additive preferably has a high dielectric constant, and is preferably selected from acrylic resins (dielectric constant: 3.0 to 4.5), nylon resins (dielectric constant: 3.5 to 5.0), cellulose resins (dielectric constant: 6.7 to 8.0), vinyl monomer-containing copolymer resins (dielectric constant: 3.0 to 8.0), fluorine resins (dielectric constant: 4.0 to 8.0), polyphenylene sulfide (dielectric constant: 3.5 to 4.0), and other resins.

The dielectric constants of the A layer and B layer can be allowed to differ by a method using materials with different dielectric constants as the resins. Alternatively, a difference in the dielectric constants can be achieved by using the same resin that constitutes the A layer and B layer, and adding an electrically conducting additive that imparts a conductivity. As described above and below, the multi-layer sheet of the present invention is characterized in that its electromagnetic wave shielding properties can be improved by dielectric polarization generated in the layer interface by alternately laminating conductively different A layer and B layer and providing a difference in the dielectric constants of the A layer and B layer. To improve the effect of the dielectric polarization, a larger difference in the dielectric constants of the A layer and B layer is more effective. On the other hand, to improve the return loss, the layer with higher dielectric constant (B layer) is preferably designed to have a dielectric constant within the specific range described later. Thus, the multi-layer sheet of the present invention is preferably configured to facilitate the material design to match the desired dielectric constant. Fine adjustment of the dielectric constant is more conveniently done with the amount of the electrically conducting additive added than with the resin constituting the layer. Thus, a multi-layer sheet in a preferred embodiment that satisfies the above conditions preferably has a configuration in which the layer with lower dielectric constant (A layer) comprises a layer containing no electrically conducting additive, while the layer with higher dielectric constant (B layer) comprises a layer containing an electrically conducting additive. In a more preferred embodiment, the resin constituting the A layer comprises a resin exhibiting a dielectric constant of 3.0 or less as described above, while the resin constituting the B layer comprises a resin exhibiting a dielectric constant of 3.0 or more as described above and containing an electrically conducting additive.

The multi-layer sheet according to embodiments of the present invention is required to comprise an alternating multilayer unit including five or more alternately laminated A layer and B layer. The term "alternately laminated" refers to a laminated state according to a regular array A(BA)n or A(BA)nB (n is an integer of 2 or more) when the structure has an A layer as the outermost layer. For example, all multi-layer sheets having a structure of A layer/B layer/A layer/B layer/A layer or B layer/A layer/B layer/A layer/B layer, regardless of the presence or absence of layers other than A layer or B layer, correspond to a structure comprising an alternating multilayer unit including a total of five or more alternately laminated A layer and B layer. In the multi-layer sheet of the present invention, as long as it has an alternating multilayer unit comprising laminated A layer and B layer, the outermost layer may be any of A layer, B layer, and layers other than A layer or B layer, and the outermost layers on the both sides may be the same or different layers. The number of the alternating multilayer unit included in the multi-layer sheet may be one or more. When two or more alternating multilayer units are included, the alternating multilayer units may have the same structure or different structures. When two or more alternating multilayer units are used, electromagnetic wave shielding for two or more wavelength ranges is easily obtained. That is, when a stack of two or more alternating multilayer units are used, simultaneous shielding against two or more desired frequency bands is easily achieved by using a stack of alternating multilayer units having peak tops in different frequency bands.

Methods for alternately laminating elastomer resins, such as rubbers include, for example, a method comprising roll pressing each two elastomer resins with different compositions to prepare sheets, and alternately laminating the distinct sheets followed by thermocompression bonding to obtain a multi-layer sheet.

On the other hand, methods for alternately laminating thermoplastic resins include, for example, a method comprising dispersing/dispersing and mixing thermoplastic resins for the layers and appropriate additives to separately prepare master batches, separately extruding the master batches using two or more extruders from different passages, and laminating them using a multi-manifold type feed block, static mixer, or other known lamination machine. Especially, the multi-layer sheet of the present invention preferably has less dispersed and even layer thicknesses in order to show high shielding performance against electromagnetic waves at specific frequencies as described later. Thus, a feed block with microslits for formation of a multi-layer sheet is especially preferably used in order to achieve high-precision lamination. Use of a slit-type feed block also allows electrically conducting additives and/or magnetic additives to be oriented and dispersed based on the laminar flow of resin, making it easy to provide a multi-layer sheet with higher dielectric constant. When a multi-layer group is formed using a slit-type feed block, the thicknesses of the layers and their distribution can be achieved by changing the lengths and widths of the slits and adjusting the pressure balance. As used herein, the term "length of a slit" means the length of the comblike portion in a slit plate, which forms passages through which A layer and B layer are alternately flow.

When preparing a multi-layer sheet in accordance with the latter method using thermoplastic resin, the melt viscosities of two different thermoplastic resins (for convenience, the thermoplastic resins are called "resin A" and "resin B") are preferably in the same level. Greatly different melt viscosities may cause disordered layer structure (flow mark) of resin at the lamination interface and result in failure of preparation of a uniform sheet. This may lead to ununiformity in the layer thicknesses of the layers, accompanied by ununiformity in the conductivities of the layers, resulting in varied electromagnetic wave shielding properties depending on the position in the multi-layer sheet. For molding into a uniform multi-layer sheet by melt extrusion, when the melt viscosity of the resin with higher melt viscosity, of the resin A and the resin B, at a specific temperature (the temperature of the melting point of the resin of the resin A and the resin B whichever is higher and plus 10° C.) and a specific shear rate (100 sec$^{-1}$), is X [poise], while the melt viscosity of the resin with lower melt viscosity is Y [poise], then their ratio (X/Y) is preferably 1.0≤X/Y≤5.0, and more preferably 1.0≤X/Y≤2.0. In addition, when the thermoplastic resin contains an electrically conducting additive as a filler, the inclusion of the filler at a high concentration causes melt viscosity changing (thixotropic behavior) depending on the shear rate, so that flow marks are more likely to occur strongly during the resin lamination process. Even thermoplastic resins alone are likely to cause flow marks during lamination due to the shear dependence of melt viscosity of some types of resins, such as olefin resins. Furthermore, a combination of resins that are likely to cause a phenomenon due to thixotropy and fillers causes strong flow marks. Thus, a resin that is unlikely to cause thixotropy is preferably used as the thermoplastic resin. Specifically, the thermoplastic resin is preferably selected from resins such as olefin copolymer resins, nylon resins, and polyester resins, considering the mixing properties of the electrically conducting additive. Alternatively, methods to allow the shear dependence of the melt viscosity to show similar properties by adding particles other than the electrically conducting additives to, or using non-Newtonian resin materials, such as olefin, in the layer with lower conductivity containing no electrically conducting additive, or by other methods, depending on the shear dependence of the melt viscosity due to addition of electrically conducting additives in the layer showing higher conductivity are effective to reduce flow marks in the multi-layer sheet.

The number of layers in the multi-layer sheet according to embodiments of the present invention is required to be 5 or more. In any of the regular arrangements described above, five layers or more are required when two or more layers with higher dielectric constant each sandwiched between layers with lower dielectric constant are included for the purpose of obtaining many interfaces where dielectric polarization occurs. Conventional single film or small layers number products have not been capable of achieving desired electromagnetic wave shielding properties unless electrically conducting additives are added in high concentration or the thickness of the sheet is increased. On the other hand, five or more layers that are alternately laminated are more likely to obtain effects due to dielectric polarization in the interface between the conductively different layers. That is, the dielectric polarization facilitates the passage of electric current inside the sheet (especially, in the region near the interface between the layers), and the resistance of the electrically conducting additive causes a loss to the energy contained in electromagnetic waves, so that electromagnetic wave shielding material with high shielding properties can be obtained. In addition, increasing the number of layers in the multi-layer sheet with a constant thickness leads to decrease in the layer thickness per layer of the multi-layer sheet, and easier dispersion and alignment of electrically conducting additives and/or magnetic additives in a direction parallel to the surface. This makes it easier to increase the conductivity and dielectric constant of the multi-layer sheet, and thus can achieve comparable conductivity and dielectric constant at lower concentration, which could not be achieved without high concentrations of electrically conducting additives and/or magnetic additives in a single-layer product. The total number of the A layer and B layer in an alternating multilayer unit included in the multi-layer sheet is preferably 11 or more, more preferably 31 or more, and still more preferably 101 or more. In addition to the effect described above, increasing the number of layers in a multi-layer sheet with a constant thickness results in increased packing density of the electrically conducting additives in the layer, decreased distance between the electrically conducting additives, increased efficiency of electron transfer among the added electrically conducting additives, and improved effectiveness as an electromagnetic wave absorbing material, and thus a larger number of layers is preferable. Larger number of layers and smaller thickness per layer result in increase in the number of layers included per a unit thickness, and enhanced effect of dielectric polarization, which can increase the dielectric constant of the multi-layer sheet. No particular upper limit is provided to the number of layers in the multi-layer sheet. When using a feed block with microslits, increase in the number of layers leads to upsizing of the machine, which causes increased manufacturing cost. Furthermore, in the case where the number of layers is increased and the thickness per layer is thinner, thixotropic behavior caused by particle addition is more likely to occur depending on the dispersion state, shape, and size of the filler, disturbing the resin flow and making the layer thicknesses greatly varied, whereby the unique high and sharp electromagnetic wave shielding properties may be impaired. Thus, the practical upper limit for the number of layers is 2000 or less.

The multi-layer sheet of the present invention may comprise a layer that acts differently, such as an electromagnetic wave reflecting layer or an electromagnetic wave absorbing layer, in addition to the alternating multilayer unit comprising five or more conductively different A layer and B layer that are alternately laminated.

Preferably, the multi-layer sheet of the present invention is an electromagnetic wave absorbing sheet containing an electrically conducting additive and/or a magnetic additive. The multi-layer sheet may also provide stronger shielding against only a specific frequency while providing broad shielding against electromagnetic waves by combining with an electromagnetic wave reflecting layer that provide shielding over broad frequency band. The multi-layer sheet may also have an enhanced electromagnetic wave absorbing effect by providing a new layer showing low dielectric constant to the outermost surface of the multi-layer sheet to reduce reflection of electromagnetic waves at the surface. In the latter case, the dielectric constant of the layer positioned at the outermost surface of the multi-layer sheet is preferably 4.0 or less, and more preferably 3.0 or less. Preferably, a resistive layer that shows the same impedance as that of the air layer is provided as a layer that reduce the surface reflection. The impedance of the air is 377Ω. Examples of known resistive layers that satisfy this resistance value include ITO.

Figure 2:
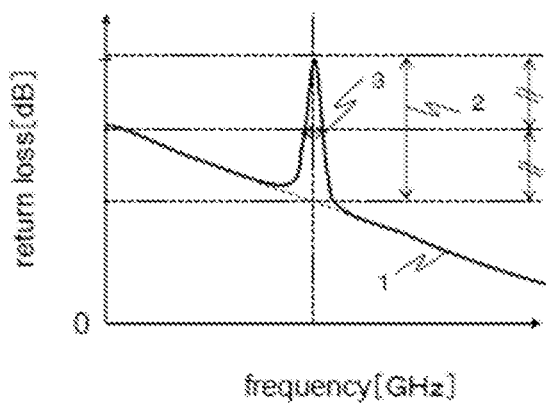
FIG. 2 is a schematic view depicting the half bandwidth of the peak of return loss spectrum with the highest return loss at the peak top, and the return loss at the peak top in the frequency-return loss curve of a multi-layer sheet in another embodiment aside from FIG. 1.
Figure 3:
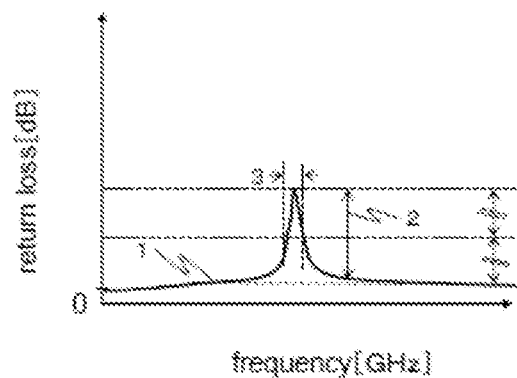
FIG. 3 is a schematic view depicting the half bandwidth of the peak of return loss spectrum with the highest return loss at the peak top, and the return loss at the peak top in the frequency-return loss curve of a multi-layer sheet in another embodiment aside from FIGS. 1 and 2.
Figure 4:
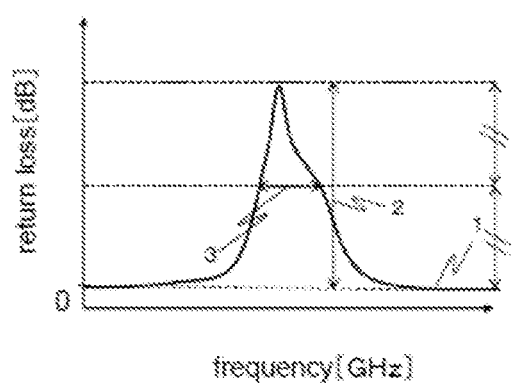
FIG. 4 is a schematic view depicting the half bandwidth of the peak of return loss spectrum with the highest return loss at the peak top, and the return loss at the peak top in the frequency-return loss curve of a multi-layer sheet in another embodiment aside from FIGS. 1 to 3.

The multi-layer sheet according to embodiments of the present invention is required to show a return loss at a peak top in the peak of return loss spectrum with the highest return loss at the peak top of 5.0 dB or more when the frequency-return loss curve is determined by plotting the return loss on the vertical axis and the frequency on the horizontal axis. The return loss is determined as described below. An electromagnetic wave is allowed to enter into a multi-layer sheet. A detector is placed on the side into which the electromagnetic wave enters, while a material for total reflection of the electromagnetic wave to the entering side is placed on the side opposite to that into which the electromagnetic wave enters. The intensity of the electromagnetic wave that has returned from the multi-layer sheet is measured. Using the intensity of the entering electromagnetic wave and the intensity of the electromagnetic wave detected by the detector, the return loss is determined according to the relationship equation expressed by equation (1) between the return loss Γ and the ratio of the intensity of the returned electromagnetic wave to the intensity of the entering electromagnetic wave (T [%]). The return loss Γ is expressed in decibel unit (dB). The measurement of the return loss and identification of the peak top are obtained according to the methods described in "return loss measurement" described later. However, different equipment systems, procedures, and methods may be used as long as the same results are obtained. Illustratively and briefly, the return loss is determined using a coaxial waveguide method or a free space method, in which an electromagnetic wave is irradiated to a multi-layer sheet combined with a metallic reflector prepared with aluminum or other metals on the back face, followed by measurement of the intensity of the electromagnetic wave returning from the multi-layer sheet. The frequency is swept, and the return loss at each frequency is measured. A plurality of peaks may be obtained in the frequency-return loss curve obtained by plotting the return loss on the vertical axis and the frequency on the horizontal axis, among which the return loss in the peak of return loss spectrum with the highest peak intensity (return loss) is focused. As used herein, the term "peak top" refers to a position where the sign (slope) reverses from positive to negative or negative to positive when considering the slope of the tangent line to a reflection loss spectrum, i.e., the point where a straight line parallel to the x axis is in contact. The return loss in the peak of return loss spectrum when a single peak top exists as shown in FIGS. 1 and 2 is expressed as the difference between the return loss at the peak top at the frequency showing the peak top and the return loss at the baseline that is drawn to the peak. Hereinafter, the return loss at the peak top in the peak of return loss spectrum is expressed as return loss RL [dB]. When the peak has high baseline loss but has a specific peak top as in FIG. 3, the difference between the losses at the baseline of the peak and the peak top is read. On the other hand, when a spectrum having a plurality of peak tops including shoulder peak as in FIG. 4, the return loss is expressed as the difference between the loss corresponding to the peak top and the loss at the baseline of the entire peak including the plurality of peak tops, at the frequency of the peak top with the highest peak of the plurality of peak tops.

[math 1]

$$\Gamma = -10\log\left(\frac{T}{200}\right) \quad (1)$$

The return loss RL in the peak of return loss spectrum expressed as above is required to represent a value of 5.0 dB or more. A return loss RL of less than 5.0 dB when the baseline return loss is 0 dB means that the transmittance of electromagnetic wave is higher than 30% because of the synonymity with return loss Γ according to the equation (1). Thus, a multi-layer sheet having a return loss RL in the peak of return loss spectrum of less than 5.0 dB does not necessarily have sufficient electromagnetic wave shielding properties. The return loss RL in the peak of return loss spectrum with the highest return loss in the multi-layer sheet of the present invention is preferably 15.0 dB or more, more preferably 20.0 dB or more, and still more preferably 30.0 dB or more. The case where the return loss RL at the peak top showing the highest return loss shows about 30.0 dB means that 99.9% shielding against entering electromagnetic waves compared with the electromagnetic wave shielding properties in frequency bands before and after the peak, meaning that the sheet has very high electromagnetic wave shielding properties. The upper limit is not particularly limited, and collaterally is preferably 100 dB or less. Preferably, the frequency band width where the return loss RL in the peak of return loss spectrum with the highest return loss at the peak top is more than 5.0 dB spans the widest possible frequency band while showing sharp and high electromagnetic wave shielding properties, in that the frequency band variation caused by the varied thickness of the multi-layer sheet can be reduced. Specifically, the frequency band width where the return loss RL in the peak of return loss spectrum with the highest return loss at the peak top is more than 5.0 dB preferably spans 1.0 GHz band or higher, more preferably 3.0 GHz band or higher, and still more preferably 5.0 GHz band or higher. Preferably, the upper limit is 20.0 GHz band or lower. A return loss RL in the peak of return loss spectrum with the highest return loss at the peak top that is shown to be a high value of 5.0 dB or more can be achieved by, for example, increasing the number of layers, reducing variation in the layer thickness, and increasing the thickness of the entire sheet, from the viewpoint of the structure of the multi-layer sheet; or by using electrically conducting additives and/or showing high conductive/magnetic properties, and increasing their concentrations from the viewpoint of additives.

In the multi-layer sheet according to embodiments of the present invention, when the return loss RL in the peak of return loss spectrum with the highest return loss at the return loss peak top is RL [dB], the frequency at which the return loss is shown is f [GHz], and the thickness of the entire multi-layer sheet is t [mm], then RL/(t×f) is preferably from 0.2 to 15. When compared with conventional technologies, the multi-layer sheet according to embodiments of the present invention is characterized in that it comprises a layer with lower dielectric constant and a layer with higher dielectric constant that are alternately laminated, whereby it can make the sheet thickness thinner and be imparted with moldability as compared with conventional sheets comprising a single film or with smaller number of layers. This characteristic also applies to sheets targeting any of the frequency bands. However, due to the tradeoff relationship shown between thickness and frequency, when the multi-layer sheet exhibits the same dielectric constant, then the thickness theoretically tends to be thinner when the frequency band is shifted toward higher frequencies. Therefore, the thin film effect of the multi-layer sheet of the present invention beyond the volume law cannot be determined solely by the relationship between the return loss RL and the thickness t (e.g., RL/t). It is important that the aforementioned relationship among the three elements, the frequency f, the thickness of the multi-layer sheet t, and the return loss RL in the peak of return loss spectrum, is better than that of the conventional technologies. RL/(t×f) is more preferably from 0.45 to 12, and most preferably from 0.75 to 10. When RL/(t×f) is less than 0.2, the return loss RL may be low, and thus sufficient electromagnetic wave shielding performance to be used for electromagnetic wave shielding applications may not be achieved, or alternatively, the electromagnetic wave shielding properties may be sufficient, but the thickness may be large, and thus sufficient performance beyond the volume law may not be shown. When RL/(t×f) is more than 15, the return loss may be high, but the thickness may be too thin, and thus the lamination precision and the film formation properties of the multi-layer sheet obtained by addition of high concentrations of electrically conducting additives and/or magnetic additives may be deteriorated. To satisfy RL/(t×f) in a preferred range, higher effectiveness can be achieved by combining the following factors: the multi-layer sheet has large number of layers, and thus in a state where dielectric polarization occurs in a large amount; the variation in the layer thickness is small; the electrically conducting additives and/or magnetic additives show high conductive/magnetic properties; and the real part and imaginary part of the dielectric constant of a layer showing high dielectric constant satisfy a dielectric constant relationship described later when the dielectric constant can be freely designed by using a plurality of electrically conducting additives. Preferred conditions for the factors are as described herein.

The peak of return loss spectrum with the highest return loss of peaks of return loss spectrum of the multi-layer sheet according to embodiments of the present invention is present in a frequency band of 1 to 100 GHz. When the multi-layer sheet according to embodiments of the present invention is used for high frequency electromagnetic wave shielding applications, which is difficult for conventional conductive reflection and magnetic absorption technologies to target, the highest loss peak is present in the GHz frequency band. For this purpose, it is most preferable to use an electrically conducting additive or a dielectric additive as described below, as a material contained in the multi-layer sheet, to form a dielectric absorption type multi-layer sheet. In general, for providing shielding against the near field corresponding to a frequency band of less than several GHz, sheets in which a dielectric substrate contains magnetic additives such as metals represented by silver and copper, and metal oxides including ferrites are used. When targeting high frequency GHz bands, magnetic additives are generally required to be contained in high concentration for compensation because of a characteristic unique to magnetic additives, that prevents magnetic loss in the frequency band higher than a certain frequency, called the Snoek's limit. Some conventional technologies use special materials such as F iron oxide. However, the material is expensive and required to be added in high concentration, and thus the technologies may be inferior to the case using electrically conducting additives from the viewpoint of cost and film formation properties. When preparing a multi-layer sheet by melt extrusion, not only thixotropic behavior will inevitably occur due to the filler contained in high concentration, but also metallic parts of the extruder may be damaged by the added magnetic additives. Thus, in order to obtain electromagnetic wave shielding properties in the GHz frequency band described above when preparing a multi-layer sheet in the melt extrusion step with addition of a low concentration of filler, an electrically conducting additive or a conductivity/magnetic composite material is preferably added to achieve electromagnetic wave absorption, by which electromagnetic wave shielding properties in a high frequency band is obtained. When targeting a frequency band of several GHz in combination with a magnetic additive, it is preferable to use metal materials with high aspect ratio, which allows electromagnetic energy loss due to high magnetic permeability. Addition of materials with high aspect ratio to the multi-layer sheet enables an arrangement of materials in the plane direction, which is difficult to achieve in conventional single-layer films, so that a material that exhibits shielding properties even in the GHz frequency band can be obtained. The aspect ratio can be expressed as the ratio of the length of the material in the thickness direction to the length of the long axis in the plane direction. When the former is t1 and the latter is t2, then t1/t2 is preferably from 0.001 to 0.95, and more preferably from 0.01 to 0.1. Since a magnetic additive with an aspect ratio smaller than 0.001 is too thin, the material may be deformed or damaged during the compounding or film forming process, and no effect of the magnetic additive may be obtained.

Preferably, the surface resistance value [$\Omega/\square$] of at least one outermost surface of the multi-layer sheet of the present invention is $1.0\times10^5$ or more. In a preferred embodiment when the multi-layer sheet is used as an electromagnetic wave absorbing sheet, reflection of electromagnetic waves at the interface between the air layer and the outermost layer of the multi-layer sheet is reduced, for loss of the energy contained in electromagnetic waves in the multi-layer sheet by efficient propagation of the electromagnetic waves in the multi-layer sheet. The reflectance R of electromagnetic waves at the interface between two regions X and Y with different dielectric constants ($\varepsilon$) and magnetic permeabilities ($\mu$) when electromagnetic waves enter vertically is expressed as in Equation (2). When focusing on reflection at the interface between the air layer and the outermost surface of the multi-layer sheet, it is particularly affected by the difference in the ratio of dielectric constant ($\varepsilon$) and magnetic permeability ($\mu$) between the air layer and the outermost surface of the multi-layer sheet. Since the dielectric constant ($\varepsilon$) and magnetic permeability ($\mu$) of the air layer are 1, it is effective to make the ratio of the dielectric constant $\varepsilon$ and magnetic permeability $\mu$ of the outermost surface of the multi-layer sheet close to 1 to reduce electromagnetic wave reflection. In specific and preferred embodiments, the resin material has a low dielectric constant and low magnetic permeability so that the conductivity and permeability are close to that of the air layer, and furthermore, no electrically conducting additive or magnetic additive is contained. When using dielectric constant/magnetic permeability as an index of insulating/conductive properties in the multi-layer sheet of the present invention, it is difficult to measure them per layers. Thus, the insulating/conductive properties of each individual layer are preferably expressed by using surface resistance value that shows an approximate correlation. In the present invention, the insulating/conductive properties are expressed as values that are measured using a high resistivity meter and a low resistivity meter manufactured by Mitsubishi Chemical Holdings Corporation according to the JIS standard. The surface resistance value [$\Omega/\square$] shown as an index of a conductivity, which is unlikely to cause surface reflection of electromagnetic waves, is preferably $1.0\times10^5$ [$\Omega/\square$] or more, more preferably $1.0\times10^9$[$\Omega/\square$] or more, and still more preferably $1.0\times10^{13}$[$\Omega/\square$] or more. The method of making the surface resistance value of the outermost surface within the range described above is not particularly limited, and methods in which electrically conducting/magnetic additives or conductive polymer components contained in the layer having the outermost surface are reduced or not contained may be used. A layer showing surface resistance value of $1.0\times10^5$[$\Omega/\square$] or more is, when installed, preferably positioned on the side where electromagnetic waves enter and positioned on at least one side, and more preferably at the outermost surfaces on the both sides. A surface resistance value showed to be $1.0\times10^5$[$\Omega/\square$] or more can be achieved by designing the layer positioned at the surface to contain low concentration of electrically conducting additives and/or magnetic additives added, or the resin to contain no conductive polymer or no additive.

[math 2]

-continued $$R = \frac{\eta_Y - \eta_X}{\eta_Y + \eta_X} \quad \eta_X = \sqrt{\frac{\mu_X}{\varepsilon_X}} \quad \eta_Y \sqrt{\frac{\mu_Y}{\varepsilon_Y}} \quad (2)$$

$\mu_X$ and $\varepsilon_X$ represent the dielectric constant and magnetic permeability in a region X, respectively, while $\mu_Y$ and $\varepsilon_Y$ represent the dielectric constant and the magnetic permeability in a region Y, respectively.

Preferably, the multi-layer sheet of the present invention contains an electrically conducting additive in the A layer or B layer. Only one electrically conducting additive may be contained, or two or more electrically conducting additives may be used in combination.

The electrically conducting additive can be selected as appropriate from organic carbon electrically conducting additives that have small primary particle sizes and are suitable for melt extrusion. Of course, the electrically conducting additive is not necessarily limited to organic carbon materials, and may be used in combination with an electromagnetic wave shielding additive or dielectric additive mainly containing an inorganic component other than non-organic carbon materials as described later. In the case of film formation of a multi-layer sheet with an extruder using only an electromagnetic wave shielding additive or dielectric additive mainly containing an inorganic component, an electromagnetic wave shielding additive is required to be added in high concentration to obtain electromagnetic wave shielding properties due to conductivity/magnetic properties, which may cause problems such as material shattering and equipment loss due to, for example, friction between the metals in the machine and in the electrically conducting additive. Thus, at least one of the electrically conducting additives preferably includes an organic carbon material containing carbon as a main component. The term "containing carbon as a main component" means that the molar ratio of carbon to all elements constituting the electrically conducting additive accounts for 50 mol % or more, preferably 80 mol % or more, more preferably 90 mol % or more, and particularly preferably 95 mol % or more.

Examples of the organic carbon electrically conducting additives include carbon blacks (spherical carbons), such as acetylene black, channel black, lamp black, thermal black, ketjen black, and furnace black, carbon nanotubes that are cylindrical carbons, such as single-walled nanotube, multi-walled nanotube, and cup stacked nanotube, and flat carbons, such as black lead, graphite, and graphene, as well as spherical graphite, cylindrical graphite, carbon microcoils, fullerene, and carbon fibers (long fiber, short fiber). Especially, conductive carbon blacks that easily develop a primary structure (linear structure) are preferably used in order to utilize the effect of particle arrangement in the plane direction due to the lamination structure and improve the conductivity of layers containing an electrically conducting additive. Carbon nanotubes, flat carbons, and the like that have uniform structures and high aspect ratios are also preferably used in combination with carbon black that develops the structure in any directions to form stronger conductive path in the layer direction without disturbing the lamination structure. Especially, materials with the size and thickness controlled in the order of nanometer are preferable, and use of carbon blacks, carbon nanotubes, graphene, and graphite, and the like are more preferable.

This aims to obtain the following effect known as Maxwell-Wagner effect. A electrically conducting additive with high aspect ratio (including higher order structures to be formed) is arranged in such a direction that the long axis direction of the material is approximately parallel to the surface of the multi-layer sheet, and contained in a resin substrate (specifically, a thermoplastic resin substrate such as a polyolefin resin, a polyester resin, an acrylic resin, or a vinyl monomer-containing copolymer resin illustrated above as resins with low dielectric constant) to provide an embodiment in which the resin substrate is sandwiched between the electrically conducting additives in layers formed by the resin substrate containing the electrically conducting additive. This results in formation of more micro-dielectric polarization at the interface between the electrically conducting additive layer and the resin substrate layer, which provide an effect of improving the electromagnetic wave shielding properties. Specifically, a dielectric electrically conducting additive contained in a resin substrate is arranged approximately parallel to the sheet plane direction through the laminar flow by a lamination process or an extension process to provide an embodiment in which the polarizations are in parallel and facing each other like a parallel plate capacitor. This facilitates accumulation of a lot of electric charge at the interface between the dielectric substrate and the electrically conducting additive when irradiating an electromagnetic wave to apply an electric field, allowing for increasing the conductivity inside the multi-layer sheet. This causes an entering electromagnetic wave to receive the resistance imparted by the electrically conducting additive, facilitating conversion of the energy of electromagnetic waves to thermal energy, which can improve the shielding properties by electromagnetic wave absorption. Among the materials described as electrically conducting additives for achieving such an embodiment through a lamination step, extension step, or other step, cylindrical materials, flat materials, carbon nanotubes, and carbon blacks with high DBP oil absorption, which are materials with high aspect ratio, are preferably used.

Carbon blacks that are preferably used in the present invention include carbon blacks with dibutyl phthalate (DBP) oil absorption [mL/100 g] of 150 or more. The DBP oil absorption [mL/100 g] is an index that indicates the degree of structure development of carbon black. In materials with large DBP oil absorption, carbon black particles are likely to be linearly linked, meaning many voids present among the structures. Conveniently, this allows for formation of conductive path to impart conductivity even with fewer amounts. The DBP oil absorption [mL/100 g] of the carbon black is more preferably 250 or more, and still more preferably 350 or more. When the structure of the carbon black develops to form a conductive path, and when an electromagnetic wave is irradiated to produce an electric field, electric charges are accumulated at the interface between the dielectric substrate and the electrically conducting additive, resulting in conversion of the energy of the electromagnetic wave into thermal energy by the electrically conducting additive that is an electromagnetic wave resistive element, whereby high shielding properties by electromagnetic wave absorption are achieved. The upper limit of the DBP oil absorption is not particularly limited, and is preferably 800 [mL/100 g] or less, considering that the structure may be destroyed when dispersed in the polymeric material that constitutes the electrically conducting component. The DBP oil absorption can be measured according to ASTM D 2414-79. Such conductive spherical carbons that can be used include those that are commercially available as, for example, acetylene black, furnace black, and ketjen black.

Examples of the electromagnetic wave shielding additive mainly containing an inorganic component, other than the electrically conducting additive described above, that can be used in the multi-layer sheet of the present invention, include single metals such as silver, copper, iron, nickel, chromium, aluminum, zinc, and tin, as well as metal oxides, metal nitrides, metal carbides, metal borides, metal oxide nitrides, metal hydroxides, metal oxide borides, metal carbonyls, and organometallic complexes thereof. Especially preferred components that can be used include indium tin oxide (ITO) and indium zinc oxide (IZO) known as transparent conductive metal oxides, and carbonyl iron, hexacyano iron, and amino iron as stainless materials and organometallic complexes. Similar to the idea about the carbon materials as described above, these inorganic metal-based magnetic additives are preferably used as spread and flat materials because the electromagnetic wave shielding properties of the multi-layer sheet of the present invention can be further improved.

In addition, a dielectric additive that has an excellent ability to store an electric charge can be added as an additive used in the multi-layer sheet of the present invention. Dielectric additives are not materials that have effects of imparting resistance against irradiated electromagnetic waves and result in a direct loss of the energy contained in the electromagnetic waves. However, as described later, the real term $\varepsilon_h'$ and imaginary term $\varepsilon_h''$ of the dielectric constant of a layer that exhibits relatively high dielectric constant of the multi-layer sheet are preferably controlled within specific ranges to provide shielding against electromagnetic waves with specific frequency bands. At this time, use of not only an electrically conducting additive with a tendency that the real term $\varepsilon_h'$ and the imaginary term $\varepsilon_h''$ of the dielectric constant vary together depending on the addition concentration, but also a dielectric additive that can selectively improve the real term $\varepsilon_h'$ of the dielectric constant, is preferable because the values of the complex dielectric constant can be more highly controlled. Examples of a dielectric additive that can be used in this case include those having a perovskite structure or a rutile structure, such as magnesium oxide, titanium oxide, barium titanate, strontium titanate, calcium titanate, lead zirconate titanate, titanium oxide, iron oxide (ferrite), and bismuth ferrite, and preferred are, for example, titanium oxide, ferrite, and barium titanate because of their multiplicity and high dielectric constant.

As the electromagnetic wave shielding additives that are used in the multi-layer sheet of the present invention, two or more materials of the organic carbon electrically conducting additives, the electromagnetic wave shielding additives mainly containing inorganic components, and the dielectric additives are preferably used in combination. This is because only use of a single material and changing of the concentration when controlling the dielectric constant of a layer exhibiting high dielectric constant described later within a preferred range that will show high electromagnetic return loss only result in a relationship between the real term and the imaginary term of the dielectric constant that shows linear behavior in the dielectric constant plane, so that it is difficult to control the dielectric constant within a specific range. Thus, use of a material showing a linear relationship between the real term and the imaginary term of the dielectric constant that is different from the material described above in combination enables control of the real term and the imaginary term of the dielectric constant in the dielectric constant plane in a two-dimensional manner, making it easy to design a multi-layer sheet that exhibits higher loss. In this case, different electrically conducting additives may be used in combination, or an electromagnetic wave shielding additive mainly containing an inorganic component or a dielectric additive may be used in combination in addition to an electrically conducting additive. In particular, iron oxide, barium titanate, titanium oxide, carbonyl iron, or the like that exhibits high complex dielectric constant can be preferably used as a second material because they can increase the real part of the complex dielectric constant without increasing the imaginary part and can more drastically adjust the dielectric constant in combination with a carbon material.

Preferably, the amount of the electromagnetic wave shielding additives contained is not less than 1 weight % and less than 15 weight % when all the components constituting the multi-layer sheet are considered as 100 mass % from the viewpoint of achieving both electromagnetic wave shielding properties and strength of the multi-layer sheet itself. In general, the amount of an electrically conducting additive is required to be large to obtain high conductivity. However, too large amount of an electrically conducting additive results in obtaining high conductivity, but significantly impairing the film formation properties and processability, which may make the sheet itself weaker. Conversely, too small amount of an electrically conducting additive may result in obtaining insufficient effects on the electromagnetic wave shielding properties, and thus the amount of an electrically conducting additive contained is preferably not less than 1 weight % and less than 15 weight %. The amount is more preferably not less than 1.5 weight % and less than 10 weight %, and still more preferably not less than 2 weight % and less than 5 weight %. When the multi-layer sheet comprises two or more electromagnetic wave shielding additives, the amount of the electromagnetic wave shielding additives is calculated by adding up the amounts of all of the electromagnetic wave shielding additives.

The electrically conducting additive contained in the multi-layer sheet of the present invention may be contained in only one of the A layer and B layer, or in both of the A layer and B layer, as described above. When both of the A layer and B layer contains electrically conducting additives providing layers with high conductivity, the interface between the layers in the multi-layer sheet does not show sufficient dielectric polarization effect. Thus, the entire multi-layer sheet shows a similar effect to a single-layer electromagnetic wave shielding material, and sharp electromagnetic wave shielding properties at a desired frequency cannot be obtained. In addition, the conductivity and dielectric constant of the layer positioned at the surface are increased, which may cause surface reflection of electromagnetic waves and reduction of the electromagnetic wave absorbing effect by an electrically conducting additive, as compared with a multi-layer sheet containing the same concentration of the electrically conducting additive in the entire multi-layer sheet and comprising a B layer containing the electrically conducting additive in a larger amount. Thus, when the multi-layer sheet has a repeating multilayer unit A(BA)n, the amount of an electrically conducting additive contained in the A layer corresponding to the surface layer is preferably less than the amount of the electrically conducting additive contained in the B layer not corresponding to the surface layer. More specifically, the total sum of the amounts of the electrically conducting additives contained in the A layer is 1 weight % or less with respect to the total weight of the multi-layer sheet, while the sum of the amounts of the electrically conducting additives contained in the B layer is 1 weight % or more with respect to the total weight of the multi-layer sheet. More preferably, the amounts of the electrically conducting additives in the A layer and B layer differ greatly, and particularly preferably, the A layer does not contain the electrically conducting additives, and only the B layer contains the electrically conducting additives.

In addition to the electrically conducting additives/magnetic additives/dielectric additives, the multi-layer sheet of the present invention may contain as necessary, for example, dispersants, surface modifiers, lubricants, crosslinkers, vulcanization accelerators, antioxidants, crystal nucleating agents, flame retardants, light absorbers (e.g., ultraviolet absorbers, dyes, and heat absorbing agents), rheology modifiers (plasticizers and thickeners), and anti-blocking agents, within ranges not impairing the original characteristics of the multi-layer sheet. These components may be contained in the A layer, the B layer, or a layer other than the A layer or the B layer without impairing the original characteristics of the multi-layer sheet.

Preferably, the multi-layer sheet of the present invention comprises the A layer as at least one of the surface layers. Providing an A layer with lower conductivity at the surface results in reduction of the reflection effect by a B layer with higher dielectric constant, so that electromagnetic waves irradiated to the multi-layer sheet can be efficiently transmitted in the multi-layer sheet, and the multi-layer sheet can show sufficient effect as an electromagnetic wave absorbing sheet. Whether the A layer is positioned at only one surface or both surfaces can be selected as appropriate considering the practicality when the multi-layer sheet is used as an electromagnetic wave absorbing material.

The electromagnetic wave shielding properties and the frequency band in the multi-layer sheet of the present invention can be determined by the impedance $Z_{in}$ and the return loss $\Gamma$ calculated therewith as represented in the equations (3) and (4). As can be seen from the equations, $Z_{in}$ and $\Gamma$ depend on the dielectric constant, magnetic permeability, and thickness of the entire sheet. Thus, the product of the real part $\varepsilon'$ of the dielectric constant and the real part $\mu'$ of the magnetic permeability is required to represent a high value to achieve high electromagnetic wave shielding properties with a thin film. In the equations (3) and (4), $Z_0$ represents the characteristic impedance of air, d represents the thickness of the multi-layer sheet, $\lambda$ represents the wavelength, $\mu$ represents the magnetic permeability of the entire multi-layer sheet, and $\varepsilon$ represents the dielectric constant of the entire multi-layer sheet. The $Z_0$ value is 377Ω.

[math 3]
$$Z_{in} = Z_o \sqrt{\frac{\mu}{\varepsilon}} \tanh t \frac{2\pi d}{\lambda} \sqrt{\varepsilon * \mu} \qquad (3)$$

[math 4]
$$\Gamma = -20 \log \frac{Z_{in} - Z_o}{Z_{in} + Z_o} \qquad (4)$$

The dielectric constant and magnetic permeability of the entire multi-layer sheet have an effect on the design of the dielectric constants of the A layer and B layer that are alternately positioned to produce dielectric polarization. Specifically, the sufficiently large difference between the dielectric constants of the A layer and B layer, and controlling of the real part $\varepsilon_h'$ and the imaginary part $\varepsilon_h''$ of the dielectric constant of a layer showing relatively higher dielectric constant are extremely effective in adjusting the electromagnetic wave shielding properties. A region showing high electromagnetic wave shielding properties against a specific frequency band with a specific sheet thickness can be determined based on the equations (3) and (4). In addition, in order for the multi-layer sheet to exhibit high electromagnetic wave shielding properties, the real part $\varepsilon_h'$ and the imaginary part $\varepsilon_h''$ of the dielectric constant of one layer with relatively higher dielectric constant of the A layer and B layer satisfy the following relation (A) or (B):

$\varepsilon h'' \geq 1$, and $0.17\varepsilon h' + 2.3 \leq \varepsilon h'' \leq 0.27\varepsilon h' + 3.3$ (A)

$5 \geq \varepsilon h'' \geq 1$, and $0.02\varepsilon h' + 1 \leq \varepsilon h'' \leq 0.07\varepsilon h' + 1.9$ (B)

By controlling the real part $\varepsilon_h'$ and the imaginary part $\varepsilon_h''$, the dielectric constant of a layer with relatively higher dielectric constant within the ranges, high electromagnetic wave shielding properties at a specific frequency can be achieved even in the case where the sheet thickness is thin.

The real part $\varepsilon'$ and the subsequently described imaginary part $\varepsilon''$ of the dielectric constant, and the real part $\mu'$ of the magnetic permeability of the multi-layer sheet of the present invention can be measured according to methods described in the section "Measurement of Dielectric Constant" in Examples. The real part and the imaginary part ($\varepsilon_h'$ and $\varepsilon_h''$) of the dielectric constant of each layer can be measured according to the methods described above and methods described in the section "Determination of Dielectric Constant of each layer" in Examples. Briefly, a jig, a waveguide or lens antennas, is used according to the frequency to be measured. An electromagnetic wave emitted from an electromagnetic wave generator enters into a sample placed in the waveguide or between the lens antennas. Then, the reflection and transmission properties of the electromagnetic wave are determined according to a known S-parameter method. The measurement equipment and calculation software are not particularly limited as long as they are capable of measurement or calculation. For example, equipment described in Examples and their accompanying calculation software can be used. In this case, the real term $\varepsilon'$ and the imaginary term $\varepsilon''$ of the dielectric constant can be determined by reading the values that are automatically calculated by the calculation software.

The method of controlling the real part $\varepsilon_h'$ and the imaginary part $\varepsilon_h''$ of the dielectric constant of a layer with relatively higher dielectric constant to satisfy the relation (A) or (B) described above includes, for example, increasing the dielectric constant by using carbon black with DBP oil absorption showing the range described below as an electrically conducting additive; barium titanate, ferrite oxide, or titanium oxide as a dielectric additive; carbonyl iron as a magnetic additive; or graphite or graphene as an electrically conducting additive with high aspect ratio. In particular, carbon black is preferably used to satisfy the equation (A) because both the real part $\varepsilon h'$ and the imaginary part $\varepsilon h''$ of the dielectric constant are required to be increased. Satisfaction of the equation (B), which require the imaginary part $\varepsilon_h''$ of the dielectric constant to be small, can be achieved by using at least one of dielectric additives such as barium titanate, ferrite, and titanium oxide, and electrically conducting additives with high aspect ratio such as graphite and graphene, alone or in combination. A further embodiment can also achieve the satisfaction, in which the layer thickness per layer is made thinner by an extension method as described below, or in which the number of layers in the multilayer multi-layer sheet is increased via a feed block with slits, and the electrically conducting additive and/or magnetic additive is(are) dispersed and arranged in the surface direction of the sheet.

Preferably, the multi-layer sheet of the present invention shows a ratio RL/fΔ of 5.0 or more, where the return loss RL [dB] is the highest return loss at the peak top of the peak of return loss spectrum and fΔ [GHz] is a half bandwidth of the peak of return loss spectrum with the highest return loss at the peak top. RL/fΔ is an index indicating the sharpness of the peak of return loss spectrum. When RL/fΔ is within such a range, a material that provides shielding against only a desired electromagnetic wave region when placed in electronic equipment, communication equipment, or other equipment can be obtained. RL/fΔ can be increased by reducing the variation in the layer thickness of the A layer and/or B layer, or increasing the difference between the dielectric constants of the more conductive layer and the less conductive layer by means of, for example, combinations of resins, use of a material with high DBP oil absorption or high aspect ratio as an electrically conducting additive, or increasing the number of layers. The ratio RL/fΔ is more preferably 10.0 or more, and still more preferably 20.0 or more. RL/fΔ of the highest peak of return loss spectrum of less than 5 means that the material provides electromagnetic wave shielding against broad frequency bands like conventional products, and may result in electromagnetic wave shielding against undesirable frequency bands even when only electromagnetic waves at a specific frequency are desired to be attenuated. The upper limit of RL/fΔ of the highest peak of return loss spectrum is not particularly limited. However, when the sharpness is very high, a slight change in the thickness of the multi-layer sheet or a change in the concentration of an electrically conducting additive may sensitively cause a shift of the position of the peak top, which can result in failure of obtaining desired electromagnetic wave shielding properties. Thus, RL/fΔ of the highest peak of return loss spectrum is preferably shown to be less than 200. The half bandwidth also depends on the frequency of the peak of return loss spectrum with the highest return loss at the peak top. Smaller half bandwidth is preferable when obtaining a multi-layer sheet of the present invention that can block only a specific frequency. Specifically, the half bandwidth fΔ [GHz] is preferably 10.0 or less, more preferably 5.0 or less, and still more preferably 2.0 or less.

The frequency of a peak top of the peak of return loss spectrum with the highest return loss at the peak top in a multi-layer sheet of the present invention can be determined based on the dielectric constant/magnetic permeability of a conductive layer. Thus, the frequency can be controlled based on not only the type and amount of the electrically conducting additive, but also the thicknesses of conductively different A layer and B layer to be alternately laminated. In electronic equipment, communication equipment, and transportation systems, frequencies that are desired and not desired to be attenuated are different depending on their applications. The multi-layer sheet of the present invention can easily control the frequency against which electromagnetic wave shielding is provided, and thus can be suitably used in the electronic equipment, communication equipment, transportation systems.

When the average value and the standard deviation of the layer thicknesses of B layers are tB [mm] and tBσ [mm], respectively, the coefficient of variation tBσ/tB of the multi-layer sheet of the present invention is preferably 0.3 or less. As described above, when the A layer is positioned at the surface and has higher surface resistance value than the B layer, the conductive B layers are main layers that contribute to electromagnetic wave shielding by electromagnetic wave absorption. When the thicknesses of these layers vary among the layers, the layers show different dielectric constants and thus cause variation in the frequency of the electromagnetic wave against which the shielding properties are obtained. When the thicknesses of the conductive B layers are the same so that the coefficient of variation tBσ/tB is within the range described above, layers showing certain dielectric constant are stacked. This can achieve sharpness in the electromagnetic wave shielding properties, preferably providing frequency selectivity with high electromagnetic return loss. The coefficient of variation tBσ/tB that represents the variation of the layer thicknesses is preferably 0.2 or less, and more preferably 0.1 or less. When the multi-layer sheet comprises a thermoplastic resin, the coefficient of variation can be reduced by using a slit-type feed block rather than by increasing the number of layers using a mixer. The lower limit of the coefficient of variation tBσ/tB is not particularly limited, and is practically 0.01 or more in light of productivity of the multi-layer sheet.

There is no limitation to the layer thickness of the A layer of the multi-layer sheet of the present invention. However, when the A layer is thinner than the distance to an electrically conducting additive contained in the B layer, no macro-dielectric polarization effect is obtained between the dielectric A layer and the conductive B layer, and the electromagnetic return loss may be decreased. Thus, the average thickness of the A layers, which is designated as tA [mm], is preferably designed to be tA≥tB in order to ensure that adjacent B layers are sufficiently separated.

Preferred embodiments of the present invention include an electromagnetic shield comprising the multi-layer sheet as described above and a reflector. The reflector is a plate material that functions to reflect electromagnetic waves. Combining a reflector with the multi-layer sheet on the opposite side from the plane of incidence of electromagnetic waves results in going and returning of electromagnetic waves in the multi-layer sheet, which can improve the electromagnetic wave absorption efficiency. Conversely, in embodiments where a reflector is placed in front, some electromagnetic waves can be reflected at the surface of the reflector, and sharp shielding against some transmitting electromagnetic waves can be provided inside the multi-layer sheet. The former structure is more preferable in order to take full advantage of the electromagnetic wave absorbing characteristics of the multi-layer sheet of the present invention.

The constituent material of the reflector is not particularly limited as long as it can reflect electromagnetic waves. Examples of the constituent material include metals such as aluminum, copper, iron, and gold, alloys such as stainless, and carbon films. The shape and thickness of the reflector are not limited as long as it is composed of a metal, an alloy, or carbon. The shape should match the applied material, and can be plate, such as plane, curved plane, hemisphere.

Examples of the reflector include plate reflectors containing a metal, an alloy, or carbon, lamination-type reflectors in which a film composed of a metal, an alloy, or carbon is formed on the surface of a polymer film, a sheet, a plate, or the like, composite reflectors in which a metal, an alloy, carbon is dispersed inside a polymer film, a sheet, a plate, or the like, and composite reflectors comprising a network composed of a metal or an alloy inside a polymer film, a sheet, a plate, or the like. In the present invention, when a support or a housing for various applications is composed of a metal, an alloy, carbon, or the like, it also can be directly used as a reflector.

Preferred embodiments of the present invention include electronic equipment and communication equipment comprising the multi-layer sheet as described above or the electromagnetic shield as described above, for the purpose of, for example, prevention of virtual images caused by electromagnetic waves used in 4G/5G communications, wireless LANs, anticollision (ITS) radars, and the like; reduction of unnecessary radiation of electromagnetic waves from electronic devices equipped within housings of computers, mobile phones, transceivers, medical devices, car bumper, and the like; and prevention of malfunction of devices due to radiation from neighboring devices. In addition, without limitation to the above, electronic equipment or communication equipment using a frequency in a GHz band may be used with equipment with the multi-layer sheet of the present invention.

Further preferred embodiments of the present invention include communication systems comprising the multi-layer sheet as described above or the electromagnetic shield as described above, such as means of transportation such as vehicles, aircrafts, and ships, the surfaces of walls of structures such as buildings, tunnels, guardrails, expressways, bridges, and steel towers, and telecommunication systems such as telegraph and telephone. Methods of applying the multi-layer sheet of the present invention may include, for example, attaching it to structures such as floors, ceilings, walls, and pillars, directly with adhesives or the like, or via other sheets, shielding plates, panels, or the like. In addition, the multi-layer sheet of the present invention may also be used as a wall material or window material in shielded rooms for protection from influence of electromagnetic jamming and noise from the outside.

Next, preferred methods of producing the alternating multilayer unit of the multi-layer sheet of the present invention will be described below. It will be understood that the present invention should not be interpreted as being limited to the embodiments described below.

Embodiments of the method of producing the alternating multilayer unit, which uses a rubber, a thermoplastic elastomer, or the like as a base polymer for the substrate, will be described below. A predetermined amount of an electrically conducting additive is added to and mixed with a base polymer using a known machine such as a kneader, a Banbury mixer, a mill mixer, a roll mill, a jet mill, or a ball mill to prepare a polymer containing the electrically conducting additive. The base polymer alone, or the prepared polymer containing the electrically conducting additive is molded into a sheet with a desired thickness by batch press rolling or melt extrusion. Thereafter, the prepared sheets corresponding to A layer and B layer are stacked, and pressed or laminated to obtain a desired multilayered alternating multilayer unit. The fusion temperature depends on the resin used, and is preferably in a temperature range from 150° C. to 400° C., and more preferably from 250 to 380° C.

Embodiments of the method of producing the alternating multilayer unit in the case of using a flexible thermoplastic resin, which is preferably used in the present invention, will be described below. A thermoplastic resin and a predetermined amount of an electrically conducting additive that are prepared in pellet states are mixed using a twin screw extruder, then extruded into a gut shape, cooled in a water tank, and cut with a tip cutter to form a master batch containing the electrically conducting additive. In this case, the electrically conducting additive may be dry-blended with the resin and quantitatively fed from a hopper, or side-fed to the molten resin using a side feeder at any position in the extruder. The method may be selected as appropriate depending on the specific gravity and shape of the electrically conducting additive to be used.

The thermoplastic resins to be contained in the A layer and B layer are dried in hot air or under vacuum, and then supplied to distinct extruders. The resins are heated to the melting point or higher temperature to melt in extruders, which are then discharged in a uniform extrusion output using a gear pump or the like. Then, foreign materials, denatured resins, and the like are removed by filtration and the like. The resins are molded into a desired shape in a die through a multi-layer stacking device that enables stacking to a desired number of layers, and then discharged in a sheet shape. The sheet discharged from the die is extruded onto a casting drum or other coolant, and quenched to obtain a cast sheet. In this case, due to the conductivity of the cast sheet itself, a method comprising allowing the sheet to be in close contact with the casting drum or other coolant via air spraying from slit-type, spot-type, or sheet-type devices, and thereby quenching the sheet, or a method comprising allowing the sheet to be in close contact with a coolant using a nip roll and thereby quenching the sheet is preferable.

The multi-layer stacking device may be, for example, a multi-manifold die, a feed block, or a static mixer, as described above. In particular, a feed block with micro-slits is preferable to efficiently obtain a multi-layered structure in the present invention. The use of such a feed block prevents the machine from being extremely upsized, resulting in less foreign materials produced by thermal degradation and allowing for high-precision lamination even in the case where the number of layers is extremely large. In addition, the lamination precision in the transverse direction is significantly improved as compared with the conventional art. Furthermore, the thickness of each layer can be adjusted based on the shape of the slits (length, width) of the machine, so that any layer thickness can be achieved. A method of increasing the number of layers by forming multi-layer groups with a feed block, and then laminating them to double the number of layers via a static mixer can be also suitably used. In this case, the layer thicknesses of the multi-layer groups formed by lamination are exactly the same, which is thus suitable for the idea according to embodiments of the present invention that favors uniform lamination thicknesses.

Subsequently, the obtained cast sheet can be biaxially oriented in the machine direction and the transverse direction, as necessary. The orientation may be sequential biaxial orientation or simultaneous biaxial orientation. Further orientation may be performed in the machine direction and/or the transverse direction.

First, the case of sequential biaxial orientation will be described. As used herein, drawing in the machine direction refers to orientation for achieving a molecular orientation in the machine direction in a sheet. Usually, such an orientation is achieved by means of the difference in the circumferential speed of rolls, and may be one-step, or multi-step by using a plurality of roll pairs. The draw ratio of orientation varies depending on the type of the resin. Typically, draw ratio of 1.1 to 15 times is preferable, and 1.5 to 4 times is particularly preferably used. The temperature during drawing is preferably set to be within the range from the glass transition temperature of the resin constituting the alternating multilayer unit to the glass transition temperature+100° C.

The thus-obtained alternating multilayer unit oriented in the machine direction can be subjected to surface treatment, such as corona treatment, flame treatment, or plasma treatment, as necessary, and then a primer layer for improving the adhesion to a film to be laminated on it can be formed. In an in-line coating process, the primer layer may be applied on one surface, or on both surfaces simultaneously or sequentially one by the other.

Orientation in the transverse direction refers to orientation for achieving orientation in the transverse direction in a sheet. Usually, a sheet is carried using a tenter with the ends of the sheet grasped by clips to stretch the sheet in the transverse direction. The draw ratio of orientation varies depending on the type of the resin. Typically, 1.1 to 15 times orientation is preferable, and 1.5 to 6 times orientation is particularly preferably used. The temperature during orientation is preferably from the glass transition temperature of the resin constituting the alternating multilayer unit to the glass transition temperature+120° C. An alternating multilayer unit that is thus biaxially orientated is subjected to heat treatment at a temperature from the temperature during orientation to the melting point in a tenter, then cooled uniformly and slowly to room temperature, and wound. In addition, as necessary, relaxing treatment in the machine direction and/or the transverse direction or the like may be used in combination during the slow cooling after the heat treatment to make the orientation angle small and impart thermal dimensional stability to the sheet.

Then, the case of simultaneous biaxial orientation will be described. In the case of simultaneous biaxial orientation, the obtained cast sheet may be subjected to surface treatment, such as corona treatment, flame treatment, of plasma treatment, as necessary, followed by in-line coating to impart functions such as smoothness, high adhesiveness, and antistatic properties. In an in-line coating process, a highly adhesive layer may be applied on one surface of the alternating multilayer unit, or on both surfaces of the alternating multilayer unit simultaneously or sequentially one by the other.

Next, the cast sheet is guided to a simultaneous biaxial tenter, and carried with the ends of the sheet grasped by clips to simultaneously stretch the sheet in the machine direction and transverse direction. Simultaneous biaxial orientation machine includes pantograph-type, screw-type, drive motor-type, and linear motor-type machine, and drive motor-type and linear motor-type machine are preferable because the draw ratio of orientation can be arbitrarily changed and relaxing treatment can be performed at any position. The draw ratio of orientation varies depending on the type of the resin. Typically, areal draw ratio of 2 to 50 times is preferable, and 4 to 20 times is particularly preferably used. The rate of orientation in the machine direction and transverse direction may be the same or different. The temperature during orientation is preferably from the glass transition temperature of the resin constituting the alternating multilayer unit to the glass transition temperature+120° C.

Preferably, the alternating multilayer unit after simultaneous biaxial orientation is subsequently subjected to heat treatment at a temperature from the temperature during orientation to the melting point in the tenter to impart flatness and dimensional stability. During the heat treatment, instant relaxing treatment in the machine direction is preferably performed immediately before and/or immediately after the alternating multilayer unit enters into the heat treatment zone to prevent distribution of the main orientation axis in the transverse direction. After the heat treatment, the alternating multilayer unit is cooled uniformly and slowly to room temperature, and wound. In addition, as necessary, relaxing treatment in the machine and/or transverse direction(s) may be performed during the slow cooling after the heat treatment. Instant relaxing treatment in the machine direction is performed immediately before and/or immediately after the alternating multilayer unit enters into the heat treatment zone.

Using the prepared alternating multilayer unit, the same alternating multilayer units, or alternating multilayer units with different thicknesses and compositions may be laminated via an adhesive sheet, a pressure sensitive adhesive sheet, a double-faced tape, or the like to achieve desired electromagnetic wave shielding properties.

Further, a layer with different dielectric constant may be laminated on the outermost surface of the alternating multilayer unit in order to, for example, increase the electromagnetic wave transmission, or induce electromagnetic wave reflection. In this case, a coating layer containing materials showing appropriate conductive/magnetic properties may be applied, and a different resin layer/mesh layer or the like may be laminated via an adhesive sheet or the like. A resin/metal layer may also be laminated by sputtering (e.g., planar or rotating magnetron sputtering), evaporation (e.g., electron beam evaporation), chemical vapor deposition, metal organic chemical vapor deposition, plasma-enhanced/-assisted/-activated chemical vapor deposition, ion sputtering, or the like which are used as metallic film coating technologies.

The present invention will now be described with reference to examples. However, the present invention should not be interpreted as being limited to these examples. The properties were measured according to the following methods.

(Method of Measuring Properties and Method of Evaluating Effect)

The methods of measuring the properties and the methods of evaluating the effects in the present invention are as described below.

(1) Layer Thickness, Number of Layers, and Lamination Structure

The layer structure of the multi-layer sheet was determined by differential interference microscope or transmission electron microscope (TEM) using a sample sectioned with a microtome according to the layer thickness of the layers constituting the multi-layer sheet. In the case of the former, more specifically when the thicknesses of the layers constituting the multi-layer sheet are 1 μm or more, the cross section of the multi-layer sheet was observed using a differential interference microscope "DMLBHC" manufactured by Leica Microsystems GmbH. under a magnification of 1000× (eye lens 10×, object lens 100×), followed by taking images of the cross section to determine the layer structure and the thicknesses of the layers. The length measurement was conducted using a particle size analysis software "Macview" (Mountech Co., Ltd.), in which the layer thickness was measured as the vertical distance between layer interfaces with a clearly identifiable contrast difference. Data were acquired at five random sites. The average values of the thicknesses of the layers were used as the measured data. As the major axis of a particle, data was used obtained by measuring a total of 100 longest distances of higher order structures formed by particles observed in the image and averaging them. For the latter transmission electron microscope (TEM), the cross section of the multi-layer sheet was observed using a transmission electron microscope H-7100FA (Hitachi, Ltd.) under an acceleration voltage of 75 kV to take a cross-sectional image, and then the layer structure and the thicknesses of the layers were determined. Optionally, a dyeing technique using $RuO_4$, $OsO_4$ or the like were used in order to obtain a higher contrast. Based on the thickness of the thinnest layer (thin film layer) of all layers that are included in an image, observation was performed at a magnification of 100,000× for a thin film layer with a thickness of less than 50 nm, 40,000× for a thin film layer with a thickness of 50 nm or more and less than 500 nm, or 10,000× for a thin film layer with a thickness of 500 nm or more, for identification of the layer thickness, the number of layers, and the lamination structure. The thicknesses of B layers in a certain cross section in the obtained images were measured, and the average value and the standard deviation of the layer thicknesses were calculated. The average values and the standard deviations of the layer thicknesses of B layers in different five cross sections were calculated, and the average value of the calculated values from the five sites was used as the average value tB [mm] and the standard deviation tBα [mm].

(2) Measurement of Return Loss

Based on the frequency band to be measured, measurement units were changed as described below for measurement. In addition, based on the obtained results, a frequency-return loss curve was obtained by plotting the return loss on the vertical axis and the frequency on the horizontal axis.

(2-1) Frequency Band of 1 GHz to 40 GHz

The return loss of the multi-layer sheet was measured using a vector network analyzer (E8361A) manufactured by Agilent Technologies Japan, Ltd. The measurement was made using a coaxial waveguide with a doughnut shape having an outer diameter of φ7 mm and an inner diameter of φ3.04 mm for a frequency band from 0.5 GHz to 18 GHz, a rectangular waveguide with a rectangle shape of 4.32 mm×10.67 mm for a frequency band from 18 to 26.5 GHz, or a rectangular waveguide with a rectangle internal shape of 3.56 mm×7.11 mm for a frequency band from 26.5 to 40 GHz. The measurements were made with the frequency increments during measurement set such that measurements at 200 frequencies in each frequency band were possible. A 3-mm aluminum metal plate was placed on the back of a multi-layer sheet sample, whereby a state was made where entering electromagnetic waves were to be totally reflected in the absence of electromagnetic wave absorption by the multi-layer sheet. A peak of return loss spectrum analysis was performed using an $S_{11}$ S-parameter value indicating the intensity ratio of a reflected electromagnetic wave to an entered electromagnetic wave.

(2-2) Frequency Band from 40 to 110 GHz

An aluminum metal plate was laminated on the back surface of a multi-layer sheet of 150 mm square to prepare a measurement sample. The return losses were measured in the frequency bands of 33 to 50 GHz (WR-22), 50 to 75 GHz (WR-15), and 75 to 110 GHz (WR-10), using a lens antenna-system, grazing incidence-type electromagnetic wave absorber (electromagnetic wave absorbing material)/return loss measurement equipment LAF-26.5B manufactured by KEYCOM Corporation, by means of irradiation of an electromagnetic wave with a grazing incidence angle of 15° according to JIS R 1679. The measurement method can also obtain values in a frequency band of 33 to 40 GHz, but the measurement data in (2-1) was used as the return loss in a frequency band of 33 GHz or more and less than 40 GHz.

(3) Measurement of Dielectric Constant

The multi-layer sheet was analyzed with the measurement unit and the measurement method changed for each frequency to be measured as described below.

(3-1) Frequency Band of 1 GHz to 40 GHz

A vector network analyzer (E8361A) manufactured by Agilent Technologies, Inc was used. A coaxial waveguide with a doughnut shape having an outer diameter of φ7 mm and an inner diameter of φ3.04 mm for a frequency band from 0.5 GHz to 18 GHz, a rectangular waveguide with a rectangle shape of 4.32 mm×10.67 mm for a frequency band from 18 to 26.5 GHz, and a rectangular waveguide with a rectangle internal shape of 3.56 mm×7.11 mm for a frequency band from 26.5 to 40 GHz were used. A multi-layer sheet sample was subjected to punching and vertically inserted into the waveguide for measurement. The frequency increments during measurement were set such that measurements at 200 frequencies in each frequency band were possible. For analysis of the complex dielectric constant, an analysis software N1500A-001 attached to the machine was used.

(3-2) Frequency Band from 40 to 110 GHz

A multi-layer sheet of 150 mm square was used. The complex dielectric constants were measured in the frequency bands of 33 to 50 GHz (WR-22), 50 to 75 GHz (WR-15), and 75 to 110 GHz (WR-10) using a lens antenna-system relative dielectric constant/loss measurement equipment LAF-26.5A using the frequency variation method manufactured by KEYCOM Corporation. Values in a frequency band of 33 to 40 GHz were measured by the measurement method, but the measurement data in (3-1) was used as the complex dielectric constant in a frequency band of 33 GHz or more and less than 40 GHz.

(4) Measurement of Surface Resistance Value (4-1) Measurement of High Resistance For regions with high resistance values ($1.0 \times 10^6$ to $1.0 \times 10^{13}$ [Ω/□]), a high resistivity meter Hiresta-UP (MCP-HT450) manufactured by Mitsubishi Chemical Holdings Corporation was used for measurement. A URS probe (MCP-HTP14) was pressed against the surface of a multi-layer sheet cut into 10 cm squares, and the resistance was measured according to JIS K 6911 (1995). The measurement was done with the measurement position changed and with the number of samples of 5, and the arithmetic average value from the obtained 5 measurements was used.

When measuring the surface resistance value of the inner layer, the probe was pressed against the surface from which the outermost layer with the thickness determined by transmission electron microscope had been ground using a grinding device for measurement.

(4-2) Measurement of Low Resistance

For regions with low resistance values ($1.0 \times 10^6$ to $1.0 \times 10^{-1}$ [Ω/□]), a low resistivity meter Loresta-EP (MCP-T360) manufactured by Mitsubishi Chemical Holdings Corporation was used for measurement. An ASP probe (MCP-TP03P) was pressed against the surface of a multi-layer sheet cut into 10 cm squares, and the resistance was measured according to JIS K 7194. The measurement was done with the measurement position changed and with the number of samples of 5, and the arithmetic average value from the obtained 5 measurements was used.

(5) DBP Oil Absorption

Measurements were performed on carbon-based conductive particles obtained by dissolving the multi-layer sheet in a solvent that can dissolve the substrate resin followed by extraction and separation, using Absorptometer-C manufactured by Brabender GmbH & Co. KG according to ASTM D2414-79. The carbon-based conductive particles were input to a mixer and mixed at a rotation speed of 125 [min$^{-1}$] with addition of DBP dropwise at a drop rate of 4 [mL/min]. DBP oil absorption analyzed based on the obtained viscosity curve was read.

(6) Determination of Dielectric Constants of Layers

A macro-software that can calculate the impedance in the case where the structure of the multi-layer sheet is replaced with equivalent electrical circuit by substituting the values of dielectric constant, magnetic permeability, and layer thickness of the A layer and B layer was prepared and used. A macro-program that continuously performs calculation for determining the return loss Γ over a certain frequency band by substituting the obtained impedance $Z_{in}$ in the equation (4) based on non-reflective relation and return loss was prepared. Then, the dielectric constant and magnetic permeability of the layers were set so that the return loss Γ matched the reflection loss spectrum measured by the method described in the section (2). The dielectric constant and magnetic permeability when the reflection loss spectrums are best resembled were read, whereby the dielectric constant and the magnetic permeability of the layers were determined. When the calculation of the dielectric constant is difficult, a single-layer sheet is prepared with the same composition as that of a layer showing relatively higher dielectric constant in Example, and a frequency showing minimum transmission loss is identified by the frequency variation method using a vector network analyzer as described above. Since the minimum value is an integral multiple of ½ the effective wavelength transmitted through the sheet thickness, the dielectric constant was determined. The same value can also be obtained using the software (SFW05) included with the free-space measuring system using the frequency variation method (Model No. DPS10) manufactured by KEYCOM Corporation.

EXAMPLES

Example 1

Using 100 parts by weight of ethylene-propylene terpolymer rubber produced by Mitsui Chemicals, Inc., it was press molded to prepare a sheet A with a thickness of 0.5 mm, and a size of 200 mm square. On the other hand, to 90 parts by weight of ethylene-propylene terpolymer rubber produced by Mitsui Chemicals, Inc. was added 10 parts by weight of a carbon black (spherical carbon) electrically conducting additive with a primary particle size of 40 nm, and a DBP oil absorption of 360, and mixed and kneaded using a two-roll mill to prepare an electrically conducting additive-containing rubber. Thereafter, the electrically conducting additive containing rubber was pressed to prepare a sheet B with a thickness of 0.5 mm, and a size of 200 mm square. These rubber molded sheets were subjected to thermocompression bonding at 250° C. such that 5 layers, the sheet A, sheet B, sheet A, sheet B, and sheet A in this order, were stacked, to obtain a multi-layer sheet having a thickness of 2.5 mm with the 5 layers laminated. Return loss measurement was performed using the multi-layer sheet to find that the multi-layer sheet had the peak of return loss spectrum with the highest return loss at the peak top and a frequency at the peak top of 30 GHz, wherein the return loss at the peak top was 12 dB, and the half bandwidth was 2 GHz.

Comparative Example 1

To 96 parts by weight of ethylene-propylene terpolymer rubber produced by Mitsui Chemicals, Inc. was added 4 parts by weight of a spherical carbon electrically conducting additive with a primary particle size of 39.5 nm and a DBP oil absorption of 360, used in Example 1, and mixed and kneaded using a two-roll mill to prepare an electrically conducting additive-containing rubber. Thereafter, the electrically conducting additive containing rubber was press molded into a sheet with a thickness of 2.5 mm and a size of 200 mm square to prepare a monolayer sheet.

Return loss measurement was performed to find that the frequency band at the peak top in the peak of return loss spectrum with the highest return loss at the peak top was the same as Example 1, but the return loss at the return loss peak top was 7 dB, and the half bandwidth was 5 GHz, representing a weaker peak of return loss spectrum with broader bandwidth than Example 1.

Example 2

To 90 parts by weight of homo polypropylene resin exhibiting a melt flow rate of 30 was added 10 parts by weight of a spherical carbon electrically conducting additive used in Example 1, and mixed and kneaded using a twin screw extruder in which the electrically conducting additive was supplied by side feeding to prepare a conductive master batch.

A homo polypropylene resin exhibiting a melt flow rate of 30 was used as a resin used on the side of A layer, while the conductive master batch was used as a resin used on the side of B layer. The prepared polypropylene resin and conductive master batch were individually charged into twin screw extruders, and melt mixed and kneaded in the twin screw extruders at 270° C. For the mixing conditions of the twin screw extruders, the screw speed relative to the discharge was set as 0.7. Next, the extruded resins were allowed to meet in a 9-multi-manifold type feed block to obtain an alternating multilayer unit with a thickness of 1 mm with 9 layers laminated alternately at a lamination ratio of 1.0 in the thickness direction. Transmission electron microscope confirmed that the obtained alternating multilayer unit comprised a total of five A layers and a total of four B layers containing an electrically conducting additive, and was alternately laminated in the thickness direction. The layer thicknesses were greater near the center in the thickness direction, with the thicknesses of the layers largely varying.

Two of the prepared alternating multilayer unit were laminated via an adhesive sheet with a thickness of 25 μm to obtain a multi-layer sheet comprising a total of 19 layers including the adhesive sheet. Return loss measurement was performed to find that the multi-layer sheet had the peak of return loss spectrum with the highest return loss at the peak top and a frequency at the peak top of 26 GHz, wherein the return loss at the peak top was 16 dB, and the half bandwidth was 2 GHz.

Comparative Example 2

Five parts by weight of a spherical carbon electrically conducting additive used in Example 2 was contained in 95 parts by weight of a homo polypropylene resin exhibiting a melt flow rate of 30 used in Example 2 to prepare a conductive master batch. The conductive master batch was charged into twin screw extruders used in Example 2 as a resin for the A layer and B layer, and an alternating multi-layer unit comprising A layer and B layer was prepared under the same conditions as in Example 2. Then, a pseudo monolayer sheet comprising A layer and B layer composed of the same material (described as comprising A layer alone in Table) with a thickness of 1 mm was prepared. Return loss measurement was performed to find that the sheet had the peak of return loss spectrum with the highest return loss at the peak top and a frequency at the peak top of 65 GHz, wherein the return loss at the peak top was 11 dB, and the half bandwidth was 10 GHz.

Comparative Example 3

Two of the pseudo monolayer sheets prepared in Comparative Example 2 (described as comprising A layer alone in Table) were laminated via an adhesive sheet with a thickness of 25 μm to obtain a multi-layer sheet comprising a total of 3 layers, two layers of the pseudo monolayer sheets and one layer of the adhesive sheet. Return loss measurement was performed to find that the multi-layer sheet had the peak of return loss spectrum with the highest return loss at the peak top and a frequency at the peak top of 36 GHz, wherein the return loss at the peak top was 13 dB, and the half bandwidth was 5 GHz.

Example 3

An alternating multilayer unit with a thickness of 1 mm was obtained in the same manner as in Example 2, except that 31 layers were laminated alternately at a lamination ratio of 1.0 in the thickness direction using a feed block having 31 slits in Example 2. Transmission electron microscope confirmed that the obtained alternating multilayer unit comprised 16 layers of A layer and 15 layers of B layer containing an electrically conducting additive, which were alternately laminated in the thickness direction. With respect to the lamination thickness, the B layer had a smaller coefficient of variation in the layer thickness than the case using a multi-manifold type feed block in Example 2, but the alternating multilayer unit showed slightly disordered layer structure due to the thixotropic behavior of the resin.

Two of the prepared alternating multilayer units were laminated via an adhesive sheet with a thickness of 25 μm to obtain a multi-layer sheet comprising a total of 63 layers including the adhesive sheet. Return loss measurement was performed to find that due to the effect of the increased number of layers, the return loss at the peak top in the peak of return loss spectrum with the highest return loss at the peak top was 20 dB, and the half bandwidth was 2.1 GHz.

Example 4

An alternating multilayer unit with a thickness of 1 mm was obtained in the same manner as in Example 3 except that the resins were allowed to meet in a feed block with 31 layers of slits followed by one step using a static mixer for doubling the number of layers in the thickness direction to increase the number of layers into 61 layers in Example 3. Transmission electron microscope confirmed that the obtained alternating multilayer unit showed formation of a unit in which 31 layers of A layer and 30 layers of B layer were alternately laminated in the thickness direction. The portion where the multi-layer groups comprising 31 layers were met showed twice thickness of the A layer. The coefficient of variation in the lamination thickness of the B layer was comparable to Example 3, but an alternating multilayer unit with more strongly disordered layer structure than Example 3 was obtained.

Two of the prepared alternating multilayer units were laminated via an adhesive sheet with a thickness of 25 μm to obtain a multi-layer sheet comprising a total of 123 layers including the adhesive sheet. Return loss measurement was performed to find that the return loss at the peak top in the peak of return loss spectrum with the highest return loss at the peak top was 24 dB, which was higher than Example 3.

Example 5

To 90 parts by weight of a polyethylene terephthalate resin exhibiting a melting point of 254° C. and an intrinsic viscosity (IV) of 0.63 as a resin constituting the B layer was added 10 parts by weight of a carbon electrically conducting additive used in Example 1, and mixed and kneaded using a twin screw extruder in which the electrically conducting additive was supplied by side feeding to prepare a conductive master batch. A polyethylene terephthalate resin with a melting point of 254° C. and an intrinsic viscosity (IV) of 0.8 was used as a resin constituting the A layer, while the conductive master batch was used as a resin constituting the B layer. The prepared resins were individually charged into twin screw extruders, and melt mixed and kneaded in the twin screw extruders at 280° C. Next, the extruded resins were allowed to meet in a feed block with 31 slits followed by one step using a static mixer to obtain an alternating multilayer unit with a thickness of 1 mm with 61 layers laminated alternately at a lamination ratio of 1.0 in the thickness direction. As compared with Example 4, the use of a resin that is less likely to exhibit a thixotropic behavior resulted in an alternating multilayer unit with few disordered layer structures.

Two of the prepared alternating multilayer units were laminated via an adhesive sheet with a thickness of 25 μm to obtain a multi-layer sheet comprising a total of 123 layers including the adhesive sheet. Return loss measurement was performed to find that the multi-layer sheet had the peak of return loss spectrum with the highest return loss at the peak top and a frequency at the peak top of 27 GHz, and the peak top was sharper than Example 4.

Example 6

A multi-layer sheet comprising a total of 123 layers was obtained in the same manner as in Example 5 except that a conductive master batch obtained by adding 1 part by weight of a spherical carbon electrically conducting additive used in Example 1 to 99 parts by weight of a polyethylene terephthalate resin showing a melting point of 254° C. and an intrinsic viscosity (IV) of 0.8 was used as a resin in the A layer, and a conductive master batch obtained by adding 9 parts by weight of a spherical carbon electrically conducting additive to 91 parts by weight of a polyethylene terephthalate resin showing a melting point of 254° C. and a viscosity (IV) of 0.63 was used as a resin in the B layer, in Example 5. Return loss measurement was performed to find that due to the conductivity of the A layer which was not very high, the multi-layer sheet had the peak of return loss spectrum with the highest return loss at the peak top and a frequency at the peak top of 26 GHz, and the peak was relatively sharp.

Example 7

A multi-layer sheet comprising a total of 123 layers was obtained in the same manner as in Example 5 except that a conductive master batch obtained by adding 10 parts by weight of a spherical carbon electrically conducting additive showing a primary particle size of 8 nm and DBP oil absorption of 95 mL/100 g as an electrically conducting additive to 90 parts by weight of a polyethylene terephthalate resin showing a melting point of 254° C. and an intrinsic viscosity (IV) of 0.8 was used as a resin in the A layer, and a conductive master batch obtained by adding 5 parts by weight of a spherical carbon electrically conducting additive used in Example 1 to 95 parts by weight of a polyethylene terephthalate resin showing a melting point of 254° C. and a viscosity (IV) of 0.63 was used as a resin in the B layer, in Example 5. Return loss measurement was performed to find that the multi-layer sheet had the peak of return loss spectrum with the highest return loss at the peak top and a frequency at the peak top of 25 GHz, and the peak had small sharpness.

Example 8

A multi-layer sheet comprising a total of 123 layers was obtained using the same resins and manufacture method as Example 5 except that the amount of the electrically conducting additive was 5 parts by weight in Example 5. Despite of lowered conductivity due to the smaller amount and the frequency band of the peak of return loss spectrum with the highest return loss at the peak top shifted to high frequency band, shielding properties with sharpness were obtained due to the lamination structure. The multi-layer sheet had the peak of return loss spectrum with the highest return loss at the peak top and a frequency at the peak top of 55 GHz, and the return loss at the peak top in the peak of return loss spectrum was 18 dB.

Example 9

A multi-layer sheet comprising a total of 123 layers was obtained using the same resins and manufacture method as Example 5 except that a carbon electrically conducting additive showing a primary particle size of 35 nm and a DBP oil absorption of 500 mL/100 g was used as an electrically conducting additive, and the amount of the electrically conducting additive added was 5 parts by weight in Example 5. The change to an electrically conducting additive with higher structure-forming properties resulted in improved conductivity, but enhanced thixotropic behavior and enhanced lamination thickness disturbance. The multi-layer sheet had the peak of return loss spectrum with the highest return loss at the peak top and a frequency at the peak top of 11 GHz, and the return loss in the peak of return loss spectrum was 25 dB, representing high loss peak.

Example 10

A multi-layer sheet comprising a total of 123 layers was obtained using the same resins and manufacture method as Example 9 except that the amount of the electrically conducting additive was 3.6 parts by weight in Example 9. Due to the smaller amount of an electrically conducting additive, a multi-layer sheet was obtained without development of a phenomenon due to thixotropy, without disordered layer structures, and with more uniform layer thickness. The obtained peak of return loss spectrum was as shown in table 2.

Example 11

A multi-layer sheet comprising a total of 123 layers was obtained using the same resins and manufacture method as Example 5 except that a carbon electrically conducting additive showing a primary particle size of 44 nm and a DBP oil absorption of 220 mL/100 g was used as an electrically conducting additive, and the amount of the electrically conducting additive added was 15 parts by weight in Example 5. The multi-layer sheet showed improved conductivity due to the high concentration of the contained electrically conducting additive that was unlikely to form a structure, but showed enhanced thixotropic behavior due to the increased particle concentration, and a disordered layer structure. The multi-layer sheet had the peak of return loss spectrum with the highest return loss at the peak top and a frequency at the peak top of 38 GHz, wherein the return loss at the peak top in the peak of return loss spectrum was 23 dB, and a sharp peak with high RL/fΔ.

Comparative Example 4

A multi-layer sheet comprising a total of 123 layers was obtained in the same manner as in Example 5 except that a spherical carbon electrically conducting additive showing a primary particle size of 8 nm and a DBP oil absorption of 95 mL/100 g was used as an electrically conducting additive, and the amount of the electrically conducting additive added was 15 parts by weight in Example 5. The contained electrically conducting additive was a carbon material for imparting black properties, and thus almost no conductivity was obtained in the layer. Return loss measurement was performed to find that the multi-layer sheet had the peak of return loss spectrum with the highest return loss at the peak top and a frequency at the peak top of 48 GHz, wherein the return loss at the peak top was 4.5 dB, and the half bandwidth was 15 GHz, representing a material showing small return loss and no sharpness in the electromagnetic return loss at all.

Example 12

A multi-layer sheet was obtained according to the same manufacture method as Example 5 except that the resin used in A layer and the resin used in B layer were exchanged, and a multi-layer sheet comprising 123 layers having a repeated structure B(AB)n in Example 5. Due to the conductive B layer positioned to be the outermost surface, which resulted in reflection of electromagnetic waves at the surface of the multi-layer sheet and weakened absorption effects inside, the material showed reduced electromagnetic wave return loss at the peak top showing the highest return loss, but had a relatively sharp peak. In this example, the less conductive layer was represented as B layer, while the more conductive layer was represented as A layer.

Example 13

5 parts by weight of a carbon electrically conducting additive used in Example 5 and 2 parts by weight of a graphene powder material with an average particle size of 5 μm were added as electrically conducting additives, and then mixed and kneaded using a twin screw extruder to which the electrically conducting additives were supplied by side feeding, to prepare a conductive master batch. A multi-layer sheet comprising a total of 123 layers was obtained using the same resins and manufacture method as Example 5 except that the master batch was used as a resin in the B layer. Due to the contained flat graphene powder, the multi-layer sheet showed remarkably improved conductivity in the direction parallel to the sheet surface in the layers containing graphene powder, and had the peak of return loss spectrum with the highest return loss at the peak top and a frequency at the peak top of 8 GHz, wherein the return loss at the peak top in the peak of return loss spectrum was 36 dB, and a sharp peak of return loss spectrum with high RL/fΔ.

Example 14

Five parts by weight of a carbon electrically conducting additive used in Example 5 and 3 parts by weight of a carbon nanotube material with an average diameter of 1.5 nm and average length of 500 nm were added as electrically conducting additives, and then mixed and kneaded using a twin screw extruder to which the electrically conducting additives were supplied by side feeding, to prepare a conductive master batch. A multi-layer sheet comprising a total of 123 layers was obtained using the same resins and manufacture method as Example 5 except that the master batch was used as a resin in the B layer. Due to the use of a carbon nanotube material with high aspect ratio, a multi-layer sheet was obtained showing improved conductivity in the direction parallel to the sheet surface in the layers containing carbon nanotube, and having the peak of return loss spectrum with the highest return loss at the peak top and a frequency at the peak top of 6 GHz, wherein the return loss at the peak top in the peak of return loss spectrum was 26 dB, and a sharp peak of return loss spectrum with high RL/fΔ.

Example 15

The alternating multilayer unit prepared in Example 13 was extended 1.4 times in the machine direction at 90° C. and 1.5 times in the transverse direction at 100° C. to obtain a multi-layer sheet with a thickness of 500 μm. Transmission electron microscope revealed a preferable tendency of graphene powder to show better arrangement in the direction parallel to the sheet surface as compared with Example 13. Four of the obtained multi-layer sheets were laminated via an adhesive to obtain a desired multi-layer sheet. Transmission electron microscope revealed a preferable tendency of both spherical carbon and graphene powder to show better arrangement in the direction parallel to the sheet surface. Due to its design that was more likely to cause dielectric polarization, the sheet showed higher loss and sharpness than Example 13.

Example 16

An alternating multilayer unit was prepared in the same manner as in Example 13 except that a feed block with a slit number of 101 was used as a laminating machine with the pressure loss controlled by the length and width of the slits, and the coefficient of variation of the layer thicknesses was 0.18 in Example 13. Two of the obtained multi-layer sheets were laminated via an adhesive to obtain a desired multi-layer sheet. A multi-layer sheet could be obtained that had the peak of return loss spectrum with the highest return loss at the peak top and a frequency at the peak top of 23 GHz, wherein the return loss at the peak top in the peak of return loss spectrum was 30 dB, and a sharp peak of return loss spectrum with high RL/fΔ.

Example 17

An alternating multilayer unit was prepared in the same manner as in Example 13 except that a feed block with a slit number of 201 was used as a laminating machine with the pressure loss controlled by the length and width of the slits in Example 13. Two of the prepared alternating multilayer units were laminated via an adhesive sheet with a thickness of 25 μm to obtain a multi-layer sheet comprising a total of 403 layers including the adhesive sheet. Transmission electron microscope of the layer thicknesses revealed that the coefficient of variation of the layer thicknesses was 0.12. The multi-layer sheet showed the properties described in table 2.

Example 18

An alternating multilayer unit was prepared in the same manner as in Example 13 except that a feed block with a slit number of 501 was used as a laminating machine with the pressure loss controlled by the length and width of the slits in Example 13. Two of the prepared alternating multilayer units were laminated via an adhesive sheet with a thickness of 25 μm to obtain a multi-layer sheet comprising a total of 1003 layers including the adhesive sheet. Transmission electron microscope of the layer thicknesses revealed that the coefficient of variation of the layer thicknesses was 0.08. The obtained multi-layer sheet showed the properties described in table 2.

Example 19

Ten parts by weight of a graphene powder material with an average particle size of 5 μm used in Example 13 was added as an electrically conducting additive, and then mixed and kneaded using a twin screw extruder to which the electrically conducting additive was supplied by side feeding, to prepare a conductive master batch. A multi-layer sheet comprising a total of 123 layers was obtained using the same resins and manufacture method as Example 13 except that the master batch was used as a resin in the B layer. Due to the high conductivity of graphene, a sharp peak top was observed at 800 MHz, showing high return loss.

Example 20

To 95 parts by weight of an isophthalic acid copolymerised polybutyrene terephthalate resin with a melting point of 210° C. was added 5 parts by weight of a carbon electrically conducting additive with a primary particle size of 40 nm and a DBP oil absorption of 400 mL/100 g, and mixed and kneaded using a twin screw extruder to which the electrically conducting additive was supplied by side feeding to prepare a conductive master batch.

A polyethylene terephthalate resin with a melting point of 254° C. and an intrinsic viscosity (IV) of 0.8 was used as a resin for use in the A layer, while the conductive master batch was used as a resin for use in the B layer. The prepared polyethylene terephthalate resin and conductive resin were individually charged into twin screw extruders, and melt mixed and kneaded in the twin screw extruders at 270° C. For the mixing conditions of the twin screw extruders, the screw speed relative to the discharge was set as 0.7. Next, the extruded resins were allowed to meet in a 11-multi-manifold type feed block, and a molten sheet with 11 layers laminated alternately at a lamination ratio of 1.0 in the thickness direction was extruded from the die. The extruded molten sheet was cooled and solidified on a cast drum with the drum rotation speed adjusted to obtain a multi-layer sheet with a thickness of 1 mm. Microscope confirmed that the obtained multi-layer sheet comprised a total of six A layers and a total of five B layers containing an electrically conducting additive, and was alternately laminated in the thickness direction. The electromagnetic wave attenuating properties of the multi-layer sheet were as shown in table 4.

Comparative Example 5

To 97.5 parts by weight of an isophthalic acid/polybutyrene terephthalate copolymer resin with a melting point of 210° C. was added 2.5 parts by weight of a conductive spherical carbon particle with a primary particle size of 40 nm and a DBP oil absorption of 400 mL/100 g, and mixed and kneaded using a twin screw extruder to which the electrically conducting additive was supplied by side feeding to prepare a conductive master batch. The master batch was extruded from the die into a sheet, and cooled and solidified on a cast drum with the drum rotation speed adjusted to obtain a monolayer sheet with a thickness of 1 mm. The performance of the obtained monolayer sheet was shown in table 3. No exceptional electromagnetic wave shielding properties beyond the volume law were obtained.

Comparative Example 6

The drum rotation speed in Comparative Example 5 was increased to obtain a monolayer sheet with a thickness of 0.5 mm. Two of the monolayer sheets were laminated via an acrylic adhesive sheet with a thickness of 0.05 mm to obtain a multi-layer sheet comprising 3 layers with the layer containing a conductive particle positioned as the outermost layer (described as comprising A layer alone in Table). The performance of the obtained monolayer sheet was as shown in table 3. The 3-layer laminated product did not provide sufficient electromagnetic wave shielding properties beyond the volume law.

Example 21

A multi-layer sheet with a thickness of 1 mm was obtained in the same manner as in Example 20 except that the two resins were allowed to meet in a feed block with 51 slits, and a molten sheet with 51 layers laminated alternately at a lamination ratio of 1.0 in the thickness direction was extruded from the die in Example 20. Microscope confirmed that the obtained multi-layer sheet comprised a total of 26 layers of A layer and a total of 25 layers of B layer containing an electrically conducting additive, and was alternately laminated in the thickness direction. As shown in table 4, the increased number of layers and the use of a slit-type feed block resulted in improved return loss in the peak of return loss spectrum.

Example 22

A multi-layer sheet with a thickness of 1 mm was obtained in the same manner as in Example 20 except that the two resins were allowed to meet in a feed block with 101 slits, and a molten sheet with 101 layers laminated alternately at a lamination ratio of 1.0 in the thickness direction was extruded from the die in Example 20. Microscope confirmed that the obtained multi-layer sheet comprised a total of 51 layers of A layer and a total of 50 layers of B layer containing an electrically conducting additive, and was alternately laminated in the thickness direction. As shown in table 4, the further increased number of layers resulted in further improved return loss in the peak of return loss spectrum.

Example 23

The drum rotation speed in Example 22 was increased to obtain an alternating multilayer unit with a thickness of 0.33 mm. Three of the alternating multilayer units were laminated via adhesive sheets with a thickness of 0.05 mm to obtain a multi-layer sheet comprising a total of 305 layers, with a thickness of about 1.0 mm. The performance of the obtained multi-layer sheet was as shown in table 4, and had affected by the increased number of layers.

Example 24

A multi-layer sheet with a thickness of 1 mm was obtained in the same manner as in Example 20 except that the two resins were allowed to meet in a feed block with 301 slits, and a molten sheet with 301 layers laminated alternately at a lamination ratio of 1.0 in the thickness direction was extruded from the die in Example 20. Microscope confirmed that the obtained multi-layer sheet comprised a total of 151 A layers and a total of 150 B layers containing an electrically conducting additive, and was alternately laminated in the thickness direction. The use of the slit-type feed block with larger number of layers resulted in obtaining the multi-layer sheet showing less unevenness in layer thickness and sharper electromagnetic wave shielding properties than Example 23.

Example 25

The drum rotation speed in Example 22 was increased to obtain a multi-layer sheet with a thickness of 0.5 mm. As shown in table 4, the reduced thickness of the film resulted in obtaining the multi-layer sheet with the frequency band of the peak of return loss spectrum with the highest return loss at the peak top shifted toward high frequency while keeping the level of the return loss as compared with the multi-layer sheet in Example 22.

Example 26

To 90 parts by weight of an isophthalic acid/polybutyrene terephthalate copolymer resin with a melting point of 210° C. was added 10 parts by weight of a carbon electrically conducting additive with a primary particle size of 44 nm and a DBP oil absorption of 220 mL/100 g used in Example 11, and mixed and kneaded using a twin screw extruder to which the electrically conducting additive was supplied by side feeding to prepare a conductive master batch.

Using a polyethylene terephthalate resin with a melting point of 254° C. and a viscosity (IV) of 0.8 as a resin used in the A layer, and the conductive master batch as a resin used in the B layer, the two resins were allowed to meet in a feed block with 101 slits that was the same as Example 22, and a molten sheet with 101 layers laminated alternately at a lamination ratio of 1.0 in the thickness direction was extruded from the die. The extruded molten sheet was cooled and solidified on a cast drum with the drum rotation speed adjusted to obtain a multi-layer sheet with a thickness of 1 mm. The addition of the material with lor conductivity at high concentration resulted in obtaining the multi-layer sheet showing good electromagnetic blocking properties in a high frequency band as shown in table 4.

Example 27

Barium titanate, a dielectric additive, was used as a dielectric constant adjusting agent for the conductive master batch in Example 26. Specifically, to 80 parts by weight of an isophthalic acid/polybutyrene terephthalate copolymer resin with a melting point of 210° C. were added 10 parts by weight of a carbon electrically conducting additive with a primary particle size of 44 nm and a DBP oil absorption of 220 mL/100 g, and 20 parts by weight of barium titanate with an average particle size of 0.5 μm produced by Sakai Chemical Industry Co., Ltd. to obtain a conductive master batch. A multi-layer sheet with a thickness of 1 mm was obtained in the same manner as in Example 26 except for that. As shown in table 4, the adjustment of the dielectric constant resulted in obtaining the multi-layer sheet with better electromagnetic wave shielding properties.

Example 28

To 95 parts by weight of an isophthalic acid/polybutyrene terephthalate copolymer resin with a melting point of 210° C. was added 5 parts by weight of a carbon electrically conducting additive with a primary particle size of 35 nm and a DBP oil absorption of 500 mL/100 g used in Example 9, and mixed and kneaded using a twin screw extruder to which the electrically conducting additive was supplied by side feeding to prepare a conductive master batch.

Using a polyethylene terephthalate resin with a melting point of 254° C. and a viscosity (IV) of 0.8 as a resin used in the A layer, and the conductive master batch as a resin used in the B layer, the two resins were allowed to meet in a feed block with 101 slits that was the same as Example 22, and a molten sheet with 101 layers laminated alternately at a lamination ratio of 1.0 in the thickness direction was extruded from the die. The extruded molten sheet was cooled and solidified on a cast drum with the drum rotation speed adjusted to obtain a multi-layer sheet with a thickness of 1 mm. As shown in table 5, despite the high imaginary part in the dielectric constant of the material, a multi-layer sheet showing high electromagnetic wave shielding properties was successfully obtained.

Example 29

Barium titanate, a dielectric additive, was used as a dielectric constant adjusting agent for the conductive master batch in Example 28. Specifically, to 85 parts by weight of an isophthalic acid/polybutyrene terephthalate copolymer resin with a melting point of 210° C. were added 5 parts by weight of a carbon electrically conducting additive with a primary particle size of 35 nm and a DBP oil absorption of 500 mL/100 g, and 20 parts by weight of barium titanate with an average particle size of 0.5 μm produced by Sakai Chemical Industry Co., Ltd. to obtain a conductive master batch. A multi-layer sheet with a thickness of 1 mm was obtained in the same manner as in Example 28 except for that. As shown in table 5, the adjustment of the dielectric constant resulted in obtaining the multi-layer sheet with very good electromagnetic wave shielding properties.

Example 30

A graphene powder material with an average particle size of 5 μm used in Example 13 was used as a different carbon electrically conducting additive, as the dielectric constant adjusting agent in the conductive master batch in Example 28. Specifically, to 95 parts by weight of an isophthalic acid/polybutyrene terephthalate copolymer resin with a melting point of 210° C. were added 2 parts by weight of a carbon electrically conducting additive with a primary particle size of 35 nm and a DBP oil absorption of 500 mL/100 g, and 3 parts by weight of the graphene powder material with an average particle size of 5 μm to obtain a conductive master batch. A multi-layer sheet with a thickness of 1 mm was obtained in the same manner as in Example 28 except for that. As shown in table 5, the adjustment of the dielectric constant resulted in obtaining the multi-layer sheet with better electromagnetic wave shielding properties than Example 28.

Example 31

A multi-layer sheet with a thickness of 1 mm was obtained in the same manner as in Example 22 except that a 6-nylon resin showing a melting point of 222° C. was used as a resin used in the A layer in Example 22. The use of a resin with high dielectric constant as a material for constituting the A layer resulted in somewhat decreased return loss as shown in table 5. This is considered to be because the balance of the dielectric constants between the A layer and B layer was not as good as in Example 22.

Example 32

A multi-layer sheet with a thickness of 1 mm was obtained in the same manner as in Example 22 except that a conductive master batch was used that was obtained by adding 2 parts by weight of a carbon electrically conducting additive showing a primary particle size of 35 nm and a DBP oil absorption of 500 mL/100 g used in Example 9 to a polyethylene terephthalate resin showing a melting point of 254° C. and a viscosity (IV) of 0.65 as a resin used in the A layer in Example 22. As shown in table 5, results were obtained that the loss was decreased as in Example 31, and furthermore the frequency band of the peak of return loss spectrum with the highest return loss at the peak top was shifted to the high frequency side.

Example 33

The molten sheet obtained in Example 22 was cooled and solidified on a cast drum, and then extended to twice its length in the sheet carrying direction using a group of rolls at a temperature adjusted to 85° C. with the circumferential speeds of the rolls being different, to obtain an extended multi-layer sheet with a thickness of 0.5 mm. The experience of the extension process had an effect of dispersing and orienting the carbon electrically conducting additive added to the B layer in the direction of the surface to improve the dielectric constant, thereby providing a multi-layer sheet with the properties shown table 5.

Example 34

The molten sheet obtained in Example 22 was cooled and solidified on a cast drum, then extended to three times its length in the sheet carrying direction using a group of rolls at a temperature adjusted to 85° C. with the circumferential speeds of the rolls being different, and rapidly cooled. Thereafter, the sheet extended in the carrying direction was continuously led to a tenter and carried with the both ends of the sheet held with clips and extended to 3.3 times the length in the transverse direction in a room at a controlled temperature of 120° C. to obtain an alternating multilayer unit with a thickness of 0.166 mm. Three of the obtained alternating multilayer units were laminated via acrylic adhesive sheets with a thickness of 0.025 mm to obtain a multi-layer sheet comprising a total of 305 layers, with a thickness of about 0.5 mm. The properties of the obtained multi-layer sheet were as shown in table 5. A multi-layer sheet with good electromagnetic wave shielding properties beyond the volume law was successfully obtained.

Example 35

The molten sheet obtained in Example 30 was subjected to the extension process described in Example 34 to obtain an alternately multi-layer sheet with a thickness of 0.166 mm. Three of the obtained alternating multilayer units were laminated via acrylic adhesive sheets with a thickness of 0.025 mm to obtain a multi-layer sheet comprising a total of 305 layers, with a thickness of about 0.5 mm. Due to the effect of flat carbon dispersed and arranged in the plane, a multi-layer sheet with good electromagnetic wave shielding properties beyond the concept of the volume law was successfully obtained as in Example 34.

TABLE 1

| | | | Example 1 | Example 2 | Example 3 | Example 4 | Example 5 | Example 6 | Example 7 | Example 8 | Example 9 |
|---|---|---|---|---|---|---|---|---|---|---|---|
| Structure of multi-layer sheet | Number of layers | layers | 5 | 19 | 63 | 123 | 123 | 123 | 123 | 123 | 123 |
| | tBσ/tB | — | 0.15 | 0.44 | 0.35 | 0.4 | 0.27 | 0.26 | 0.27 | 0.25 | 0.32 |
| | Sheet thickness | mm | 2.5 | 2.0 | 2.0 | 2.0 | 2.0 | 2.0 | 2.0 | 2.0 | 2.0 |
| Surface resistance values of layers | A layer | Ω/□ | $1.0 \times 10^{15}$ | $3.0 \times 10^{13}$ | $3.0 \times 10^{13}$ | $3.0 \times 10^{13}$ | $6.0 \times 10^{13}$ | $2.0 \times 10^{9}$ | $7.0 \times 10^{7}$ | $6.0 \times 10^{13}$ | $6.0 \times 10^{13}$ |
| | B layer | Ω/□ | $8.0 \times 10^{3}$ | $7.0 \times 10^{3}$ | $7.0 \times 10^{3}$ | $7.0 \times 10^{3}$ | $7.0 \times 10^{3}$ | $1.0 \times 10^{4}$ | $4.0 \times 10^{4}$ | $7.0 \times 10^{4}$ | $3.0 \times 10^{3}$ |
| Dielectric constant | Surface layer | F/m | 3.2 | 2.3 | 2.3 | 2.3 | 2.9 | 3.1 | 3.4 | 2.9 | 2.9 |
| | Real part of complex dielectric constant of B layer (εh') | F/m | 5.2 | 5.5 | 5.9 | 6.2 | 6.2 | 6.0 | 5.4 | 4.4 | 7.8 |
| | Imaginary part of complex dielectric constant of B layer (εh") | F/m | 2.7 | 3.3 | 3.8 | 4.4 | 4.5 | 4.2 | 3.8 | 2.6 | 4.9 |
| | Satisfaction of formulae (A) and (B) | | — | A | A | A | A | A | A | B | A |
| Electrically conducting additive | Type | — | spherical carbon | spherical carbon | spherical carbon | spherical carbon | spherical carbon | spherical carbon | spherical carbon | spherical carbon | spherical carbon |
| | Layer included | — | B | B | B | B | B | A and B | A and B | B | B |
| | Amount*2 | weight % | 4 | 4.4 | 4.4 | 4.8 | 5 | A layer: 0.5 B layer: 4.5 | A layer: 5 B layer: 2.5 | 2.5 | 2.5 |
| | DBP oil absorption | mL/100 g | 360 | 360 | 360 | 360 | 360 | 360 | 95/360 | 360 | 500 |
| Properties of the peak of return loss spectrum with the Highest return loss at the peak top | Frequency at peak top | GHz | 30 | 26 | 25 | 26 | 27 | 26 | 25 | 55 | 11 |
| | Return loss (RL) | dB | 12 | 16 | 20 | 24 | 27 | 23 | 18 | 18 | 25 |
| | RL/(t × f) | dB/(GHz · mm) | 0.20 | 0.31 | 0.40 | 0.46 | 0.50 | 0.44 | 0.36 | 0.16 | 1.14 |
| | Half bandwidth (fΔ) | GHz | 2.0 | 2.0 | 2.1 | 2.7 | 2.2 | 2.3 | 2.3 | 2.0 | 1.8 |
| | RL/fΔ | dB/GHz | 6.0 | 8.0 | 9.5 | 8.8 | 11.8 | 10.0 | 7.8 | 9.0 | 17.7 |

*1 A: satisfy formula (A), B: satisfy formula (B), do not satisfy both formula (A) and (B)
*2) Amount when considering the entire multi-layer sheet as 100 weight %

TABLE 2

| | | | Example 10 | Example 11 | Example 12 | Example 13 | Example 14 | Example 15 | Example 16 | Example 17 | Example 18 | Example 19 |
|---|---|---|---|---|---|---|---|---|---|---|---|---|
| Structure of multi-layer sheet | Number of layers | layers | 123 | 123 | 123 | 123 | 123 | 495 | 203 | 403 | 1003 | 123 |
| | tBσ/tB | — | 0.26 | 0.3 | 0.39 | 0.26 | 0.27 | 0.26 | 0.18 | 0.12 | 0.08 | 0.20 |
| | Sheet thickness | mm | 2.0 | 2.0 | 2.0 | 2.0 | 2.0 | 2.0 | 2.0 | 2.0 | 2.0 | 2.0 |
| Surface resistance values of layers | A layer | Ω/□ | $6.0 \times 10^{13}$ | $6.0 \times 10^{13}$ | $7.0 \times 10^{3}$ | $6.0 \times 10^{13}$ | $6.0 \times 10^{13}$ | $6.0 \times 10^{13}$ | $6.0 \times 10^{13}$ | $6.0 \times 10^{13}$ | $6.0 \times 10^{13}$ | $6.0 \times 10^{13}$ |
| | B layer | Ω/□ | $2.0 \times 10^{4}$ | $5.0 \times 10^{3}$ | $6.0 \times 10^{13}$ | $6.0 \times 10^{2}$ | $9.0 \times 10^{1}$ | $4.0 \times 10^{2}$ | $3.0 \times 10^{2}$ | $1.0 \times 10^{2}$ | $8.0 \times 10^{1}$ | $3.0 \times 10^{1}$ |
| Dielectric constant | Surface layer | F/m | 2.9 | 2.9 | 6.6 | 2.9 | 2.9 | 2.9 | 2.9 | 2.9 | 2.9 | 2.9 |
| | Real part of complex dielectric constant of B layer (εh') | F/m | 5.3 | 8.4 | 6.5 | 9.2 | 12.0 | 14.8 | 12.2 | 17.4 | 22.0 | 23.0 |
| | Imaginary part of complex dielectric constant of B layer (εh") | F/m | 3.1 | 2.3 | 4.4 | 5.6 | 6.1 | 7.1 | 6.4 | 7.7 | 9.2 | 3.1 |
| | Satisfaction of formulae (A) and (B) *1 | | — | B | A | A | A | A | A | A | A | B |

TABLE 2-continued

|  |  |  | Example 10 | Example 11 | Example 12 | Example 13 | Example 14 | Example 15 | Example 16 | Example 17 | Example 18 | Example 19 |
|---|---|---|---|---|---|---|---|---|---|---|---|---|
| Electrically conducting additive | Type |  | spherical carbon | spherical carbon | spherical carbon | spherical / flat carbon | spherical/ cylindrical carbon | spherical/ flat carbon | spherical/ flat carbon | spherical / flat carbon | spherical / flat carbon | flat carbon |
|  | Layer included | — | B | B | A | B | B | B | B | B | B | B |
|  | Amount*[2] | weight % | 1.8 | 7.5 | 5 | 2.5/1.0 | 2.5/1.5 | 2.5/1.0 | 2.5/1.0 | 2.5/1.0 | 2.5/1.0 | 5 |
|  | DBP oil absorption | mL/100 g | 500 | 220 | 360 | 360/— | 360/— | 360/— | 360/— | 360/— | 360/— | — |
| Properties of the peak of return loss spectrum with the highest return loss at the peak top | Frequency at peak top | GHz | 34 | 38 | 30 | 8 | 6 | 10 | 23 | 20 | 18 | 0.8 |
|  | Return loss (RL) | dB | 14 | 23 | 10 | 36 | 26 | 36 | 30 | 35 | 50 | 35 |
|  | RL/(t × f) | dB/(GHz · mm) | 0.21 | 0.30 | 0.17 | 2.25 | 2.17 | 1.80 | 0.65 | 0.88 | 1.39 | 21.88 |
|  | Half bandwidth (fΔ) | GHz | 1.5 | 1.6 | 2.1 | 1.0 | 0.8 | 0.7 | 0.8 | 0.6 | 0.5 | 0.2 |
|  | RL/fΔ | dB/GHz | 20.0 | 14.4 | 8.6 | 36.0 | 51.3 | 65.7 | 55.0 | 83.3 | 100.0 | 175.0 |

*[1] A: satisfy formula (A), B: satisfy formula (B), do not satisfy both formula (A) and (B)
*[2] Amount when considering the entire multi-layer sheet as 100 weight %

TABLE 3

|  |  |  | Comparative Example 1 | Comparative Example 2 | Comparative Example 3 | Comparative Example 4 | Comparative Example 5 | Comparative Example 6 |
|---|---|---|---|---|---|---|---|---|
| sStructure of multi-layer sheet | Number of layers | layers | 1 | 1 | 3 | 123 | 1 | 3 |
|  | tBσ/tB | — | — | — | — | 0 | — | — |
|  | Sheet thickness | mm | 2.5 | 1.0 | 2.0 | 2.0 | 1.0 | 1.0 |
| Surface resistance values of layers | A layer | Ω/□ | 7.0 × 10$^4$ | 4.0 × 10$^3$ | 4.0 × 10$^3$ | 6.0 × 10$^{13}$ | 6.0 × 10$^3$ | 6.0 × 10$^3$ |
|  | B layer | Ω/□ | — | — | — | 5.0 × 10$^9$ | — | — |
| Dielectric constant | Surface layer | F/m | 5.0 | 5.2 | 5.2 | 2.9 | 6.3 | 6.3 |
|  | Real part of complex dielectric constant (εh')*[3] | F/m | 5.0 | 5.2 | 5.2 | 3.6 | 6.3 | 6.3 |
|  | Imaginary part of complex dielectric constant (εh")*[3] | F/m | 2.6 | 2.7 | 2.7 | 0.5 | 2.8 | 2.8 |
|  | Satisfaction of formulae (A) and (B) *[1] |  | — | — | — | — | — | — |
| Electrically conducting additive | Type | — | spherical carbon | spherical carbon | spherical carbon | spherical carbon | spherical carbon | spherical carbon |
|  | Layer included | — | A | A | A | B | A | A |
|  | Amount*[2] | weight % | 4 | 5 | 4.4 | 8 | 2.5 | 2.5 |
|  | DBP oil absorption | mL/100 g | 360 | 360 | 360 | 95 | 380 | 380 |
| Properties of the peak of return loss spectrum with the highest return loss at the peak top | Frequency at peak top | GHz | 31 | 65 | 36 | 48 | 64 | 92 |
|  | Return loss (RL) | dB | 7.0 | 11.0 | 13.0 | 4.5 | 23.0 | 28.0 |
|  | RL/(t × f) | dB/(GHz · mm) | 0.11 | 0.08 | 0.18 | 0.05 | 0.18 | 0.15 |
|  | Half bandwidth (fΔ) | GHz | 5.0 | 10.0 | 5.0 | 15 | 18 | 24.0 |
|  | RL/fΔ | dB/GHz | 1.4 | 1.1 | 2.6 | 0.3 | 1.3 | 1.2 |

*[1] A: satisfy formula (A), B: satisfy formula (B), do not satisfy both formula (A) and (B)
*[2] Amount when considering the entire multi-layer sheet as 100 weight %
*[3] The value of B layer when B layer exists, or the value of A layer when it comprises only A layer.

TABLE 4

|  |  |  | Example 20 | Example 21 | Example 22 | Example 23 | Example 24 | Example 25 | Example 26 | Example 27 |
|---|---|---|---|---|---|---|---|---|---|---|
| Structure of multi-layer sheet | Number of layers | layers | 11 | 51 | 101 | 305 | 301 | 101 | 101 | 101 |
|  | tBσ/tB | — | 0.45 | 0.27 | 0.25 | 0.25 | 0.15 | 0.25 | 0.25 | 0.25 |
|  | Sheet thickness | mm | 1 | 1 | 1 | 1 | 1 | 0.5 | 1 | 1 |
| Surface resistance values of layers | A layer | Ω/□ | 6.0 × 10$^{13}$ | 6.0 × 10$^{13}$ | 6.0 × 10$^{13}$ | 6.0 × 10$^{13}$ | 6.0 × 10$^{13}$ | 6.0 × 10$^{13}$ | 6.0 × 10$^{13}$ | 6.0 × 10$^{13}$ |
|  | B layer | Ω/□ | 7.0 × 10$^4$ | 5.0 × 10$^4$ | 4.0 × 10$^4$ | 2.0 × 10$^4$ | 9.0 × 10$^3$ | 2.0 × 10$^4$ | 1.0 × 10$^4$ | 1.0 × 10$^4$ |

TABLE 4-continued

| | | | Example 20 | Example 21 | Example 22 | Example 23 | Example 24 | Example 25 | Example 26 | Example 27 |
|---|---|---|---|---|---|---|---|---|---|---|
| Dielectric constant | Surface layer | F/m | 2.9 | 2.9 | 2.9 | 2.9 | 2.9 | 2.9 | 2.9 | 2.9 |
| | Real part of complex dielectric constant of B layer ($\varepsilon h'$) | F/m | 6.5 | 7.0 | 7.3 | 8.7 | 8.9 | 8.1 | 8.9 | 12.1 |
| | Imaginary part of complex dielectric constant of B layer ($\varepsilon h''$) | F/m | 3.0 | 3.9 | 4.3 | 5.2 | 5.4 | 5.1 | 2.5 | 2.6 |
| | Satisfaction of formulae (A) and (B) *[1] | | — | A | A | A | A | A | B | B |
| Electrically conducting additive | Type | | spherical carbon | spherical carbon | spherical carbon | spherical carbon | spherical carbon | spherical carbon | spherical carbon | spherical carbon/ barium titanate |
| | Layer included | — | B | B | B | B | B | B | B | B |
| | Amount*[2] | weight % | 2.5 | 2.5 | 2.5 | 2.5 | 2.5 | 2.5 | 5 | 5/10 |
| | DBP oil absorption | mL/100 g | 380 | 380 | 380 | 380 | 380 | 380 | 220 | 220/— |
| Properties of the peak of return loss spectrum with the highest return loss at the peak top | Frequency at peak top | GHz | 40 | 36 | 36 | 32 | 27 | 69 | 94 | 84 |
| | Return loss (RL) | dB | 12 | 17 | 21 | 25 | 31 | 27 | 22 | 29 |
| | RL/(t × f) | dB/(GHz · mm) | 0.30 | 0.47 | 0.58 | 0.78 | 1.15 | 0.78 | 0.23 | 0.35 |
| | Half bandwidth (fΔ) | GHz | 15 | 10 | 8 | 5 | 4 | 10 | 10 | 5 |
| | RL/fΔ | dB/GHz | 0.8 | 1.7 | 2.6 | 5.0 | 7.8 | 2.7 | 2.2 | 5.8 |

*[1] A: satisfy formula (A), B: satisfy formula (B), do not satisfy both formula (A) and (B)
*[2] Amount when considering the entire multi-layer sheet as 100 weight %

TABLE 5

| | | | Example 28 | Example 29 | Example 30 | Example 31 | Example 32 | Example 33 | Example 34 | Example 35 |
|---|---|---|---|---|---|---|---|---|---|---|
| Structure of multi-layer sheet | Number of layers | layers | 101 | 101 | 101 | 101 | 101 | 101 | 305 | 305 |
| | tBσ/tB | — | 0.25 | 0.25 | 0.25 | 0.25 | 0.25 | 0.25 | 0.25 | 0.25 |
| | Sheet thickness | mm | 1 | 1 | 1 | 1 | 1 | 0.5 | 0.5 | 0.5 |
| Surface resistance values of layers | A layer | Ω/□ | $6.0 \times 10^{13}$ | $6.0 \times 10^{13}$ | $6.0 \times 10^{13}$ | $6.0 \times 10^{13}$ | $4.0 \times 10^{5}$ | $6.0 \times 10^{13}$ | $6.0 \times 10^{13}$ | $6.0 \times 10^{13}$ |
| | B layer | Ω/□ | $3.0 \times 10^{3}$ | $3.0 \times 10^{3}$ | $3.0 \times 10^{3}$ | $4.0 \times 10^{4}$ | $4.0 \times 10^{4}$ | $9.0 \times 10^{3}$ | $6.0 \times 10^{3}$ | $5.0 \times 10^{2}$ |
| Dielectric constant | Surface layer | F/m | 2.9 | 2.9 | 2.9 | 4.2 | 4.8 | 2.9 | 2.9 | 2.9 |
| | Real part of complex dielectric constant of B layer ($\varepsilon h'$) | F/m | 9.1 | 11.4 | 8.2 | 7.3 | 7.3 | 8.5 | 9.2 | 14.0 |
| | Imaginary part of complex dielectric constant of B layer ($\varepsilon h''$) | F/m | 6.5 | 6.4 | 5.5 | 4.3 | 4.3 | 5.4 | 6.1 | 6.9 |
| | Satisfaction of formulae (A) and (B) *[1] | | — | A | A | A | A | A | A | A |
| Electrically conducting additive | Type | — | spherical carbon | spherical carbon/ barium titanate | spherical carbon/ flat carbon | spherical carbon | spherical carbon | spherical carbon | spherical carbon | spherical carbon/ flat carbon |
| | Layer included | — | B | B | B | B | A and B | B | B | B |
| | Amount*[2] | weight % | 2.5 | 2.5/10 | 1/1.5 | 2.5 | A layer: 1 B layer: 2.5 | 2.5 | 2.5 | 1/1.5 |
| | DBP oil absorption | mL/100 g | 500 | 500/— | 500/— | 380 | 500/380 | 380 | 380 | 500/— |

TABLE 5-continued

|  |  |  | Example 28 | Example 29 | Example 30 | Example 31 | Example 32 | Example 33 | Example 34 | Example 35 |
|---|---|---|---|---|---|---|---|---|---|---|
| Properties of the peak of return loss spectrum with the highest return loss at the peak top | Frequency at peak top | GHz | 32 | 30 | 34 | 33 | 94 | 68 | 66 | 52 |
|  | Return loss (RL) | dB | 22 | 40 | 34 | 17 | 20 | 30 | 39 | 38 |
|  | RL/(t × f) | dB/(GHz · mm) | 0.69 | 1.33 | 1.00 | 0.52 | 0.21 | 0.88 | 1.18 | 1.46 |
|  | Half bandwidth (fΔ) | GHz | 7.0 | 3.0 | 4.5 | 10.0 | 8.0 | 11.0 | 6.0 | 6.0 |
|  | RL/fΔ | dB/GHz | 3.1 | 13.3 | 7.6 | 1.7 | 2.5 | 2.7 | 6.5 | 6.3 |

[1] A: satisfy formula (A), B: satisfy formula (B), do not satisfy both formula (A) and (B)
[2] Amount when considering the entire multi-layer sheet as 100 weight %

The multi-layer sheet of the present invention can achieve high electromagnetic return loss while containing a low concentration of an electrically conducting additive and being a thin film, which has been difficult to be achieved with conventional single films or sheets with small number of layers, by containing a unit comprising a highly conductive layer and a poorly conductive layer that are alternately laminated. In a preferred embodiment, the multi-layer sheet of the present invention can provide sharp and strong shielding from only electromagnetic waves with specific frequencies, and thus can prevent, for example, malfunctioning of devices using electromagnetic waves with similar frequency bands, and information leakage during mass information communication using electromagnetic waves with high frequencies. Specifically, the multi-layer sheet of the present invention can be suitably used in electronic equipment and communication equipment utilizing communications technology using electromagnetic waves in GHz frequency bands; vehicles used as transfer means equipped with them; and transportation systems including all infrastructure for traffic control.

REFERENCE SIGNS LIST

1: peak of return loss spectrum
2: return loss at the peak top in the peak of return loss spectrum with the highest return loss at the peak top (return loss RL)
3: half bandwidth of the peak of return loss spectrum with the highest return loss at the peak top

The invention claimed is:

1. A multi-layer sheet comprising an alternating multi-layer unit including a total of five or more alternately laminated layers of two conductively different layers, wherein for convenience the less conductive layer is called A layer and the more conductive layer is called B layer;
   wherein, when the frequency-return loss curve for the multi-layer sheet is determined by plotting the return loss on the vertical axis and the frequency on the horizontal axis, the return loss at the peak top in the peak of return loss spectrum with the highest return loss at the peak top (return loss RL) is 5.0 dB or more.

2. The multi-layer sheet according to claim 1, wherein when the return loss at the peak top in the peak of return loss spectrum with the highest return loss at the peak top is RL [dB], the frequency corresponding to the peak top is f [GHz], and the thickness of the multi-layer sheet is t [mm], then RL/(t×f) is from 0.2 to 15.

3. The multi-layer sheet according to claim 1, wherein the peak of return loss spectrum with the highest return loss at the peak top exists over the frequency band from 1 to 100 GHz.

4. The multi-layer sheet according to claim 1, wherein the surface resistance value of at least one outermost surface of the multi-layer sheet is $1.0 \times 10^5$ [(Ω/□] or more.

5. The multi-layer sheet according to claim 1, wherein any one of the A layer and the B layer contains an electrically conducting additive.

6. The multi-layer sheet according to claim 5, wherein only the B layer contains an electrically conducting additive, and wherein the B layer has a higher conductivity than the A layer.

7. The multi-layer sheet according to claim 6, wherein when the average value of the layer thicknesses of the B layers is tB [mm], and the standard deviation is tBσ [mm], then the coefficient of variation tBσ/tB is 0.3 or less.

8. The multi-layer sheet according to claim 5, wherein the electrically conducting additive is a material containing carbon as a main component.

9. The multi-layer sheet according to claim 8, wherein the material containing carbon as a main component is carbon black.

10. The multi-layer sheet according to claim 9, wherein the dibutyl phthalate (DBP) oil absorption of the carbon black is 150 [mL/100 g] or more.

11. The multi-layer sheet according to claim 9, comprising an electrically conducting additive other than spherical carbon in addition to the carbon black.

12. The multi-layer sheet according to claim 5, comprising the electrically conducting additive in an amount of not less than 1 weight % and less than 15 weight % with respect to the total weight of the multi-layer sheet.

13. The multi-layer sheet according to claim 6, wherein the real part εh' [F/m] and the imaginary part εh"[F/m] of the complex dielectric constant of the B layer satisfy the following formula (A) or (B):

$$\varepsilon h'' \geq 1, \text{ and } 0.17\varepsilon h' + 2.3 \leq \varepsilon h'' \leq 0.27\varepsilon h' + 3.3 \quad (A)$$

$$5 \geq \varepsilon h'' \geq 1, \text{ and } 0.02\varepsilon h' + 1 \leq \varepsilon h'' \leq 0.07\varepsilon h' + 1.9 \quad (B).$$

14. The multi-layer sheet according to claim 1, wherein both of the A layer and the B layer comprise a thermoplastic resin as a main component.

15. The multi-layer sheet according to claim 1, wherein when the half bandwidth of the peak of return loss spectrum with the highest electromagnetic return loss at the peak top is fΔ [GHz], and the electromagnetic return loss at the peak top in the peak of return loss spectrum with the highest electromagnetic return loss at the peak top (max return loss) is RL [dB], then the ratio RL/fΔ is 5.0 or more.

16. An electromagnetic shield comprising a multi-layer sheet according to claim 1 and a reflector.

17. Electromagnetic wave-relating equipment falling under any of electronic equipment, communication equipment, and equipment used in transportation systems, comprising at least one of the multi-layer sheet according to claim 1 and the electromagnetic shield comprising the multi-layer sheet according to claim 1 and the reflector.

* * * * *